United States Patent [19]
Nakao

[11] Patent Number: 5,962,172
[45] Date of Patent: Oct. 5, 1999

[54] METHOD AND APPARATUS FOR MANUFACTURING PHOTOMASK AND METHOD OF MANUFACTURING A SEMICONDUCTOR DEVICE

[75] Inventor: Shuji Nakao, Hyogo, Japan

[73] Assignee: Mitsubishi Denki Kabushiki Kaisha, Tokyo, Japan

[21] Appl. No.: 08/897,613

[22] Filed: Jul. 21, 1997

[30] Foreign Application Priority Data

Nov. 12, 1996 [JP] Japan .................................. 8-300132

[51] Int. Cl.$^6$ ....................................................... G03F 9/00
[52] U.S. Cl. ............................................................ 430/5
[58] Field of Search .......................... 430/5, 22; 356/399; 384/144

[56] References Cited

U.S. PATENT DOCUMENTS 5,468,580 11/1995 Tanaka ........................................ 430/22
5,773,180 6/1996 Tomimatu ................................. 430/22

FOREIGN PATENT DOCUMENTS 63-148628 6/1988 Japan .
2-215120 3/1990 Japan .
3-110564 5/1991 Japan .

*Primary Examiner*—S. Rosasco
*Attorney, Agent, or Firm*—McDermott, Will & Emery

[57] ABSTRACT

A method of manufacturing a photomask includes the steps of determining deviation quantities between positions of first and second resist patterns by comparison between the first and second resist patterns, calculating quantities for shifting mask pattern positions based on the deviation quantities between the resist pattern positions, respectively, calculating quantities for shifting drawing fields based on the quantities for shifting the mask pattern positions, respectively, and drawing predetermined mask patterns on a mask substrate in accordance with the quantities for shifting the drawing fields, respectively.

6 Claims, 22 Drawing Sheets

FIG.9

$\Delta_{nn} = (\alpha_{nn1} - \alpha_{nn2}, \beta_{nn1} - \beta_{nn2}) = (\Delta x(X_n, Y_n), \Delta y(X_n, Y_n))$ $\Delta_{n1} = (\alpha_{n11} - \alpha_{n12}, \beta_{n11} - \beta_{n12}) = (\Delta x(X_n, Y_1), \Delta y(X_n, Y_1))$ $\Delta_{1n} = (\alpha_{1n1} - \alpha_{1n2}, \beta_{1n1} - \beta_{1n2}) = (\Delta x(X_1, Y_n), \Delta y(X_1, Y_n))$ $\Delta_{11} = (\alpha_{111} - \alpha_{112}, \beta_{111} - \beta_{112}) = (\Delta x(X_1, Y_1), \Delta y(X_1, Y_1))$

X →
Y ←

5,962,172

METHOD AND APPARATUS FOR MANUFACTURING PHOTOMASK AND METHOD OF MANUFACTURING A SEMICONDUCTOR DEVICE

BACKGROUND OF THE INVENTION

1. Field of the Invention

The present invention relates to a method and an apparatus for manufacturing a photomask, as well as to a method of manufacturing a semiconductor device. More specifically, the present invention relates to a method and an apparatus for forming a photomask which is used as a master of a transfer pattern in a process of manufacturing a semiconductor integrated circuit, and to the method of manufacturing the semiconductor device.

2. Description of the Prior Art

Elements forming semiconductor integrated circuits have recently been miniaturized to a higher extent. Miniaturization of the semiconductor integrated circuit is allowed owing to photolithography by which a fine pattern can be formed with high accuracy. For miniaturizing the pattern, a wavelength of exposure light is reduced, and a numerical aperture of a reducing projection exposing device (which will be referred to as a "stepper" hereinafter) is increased. According to the current technology, a device using KrF laser (wavelength of 248 nm) and having a pattern of 0.25 $\mu$m in width is available.

Although miniaturization of the pattern has been developed as described above, it is essential for increasing a degree of integration to overlay or stack a plurality of patterns with high accuracy. This overlay accuracy may be lowered due to an expansion strain (specifically expansion and contraction strain), a rotational strain and a field strain of a stepper. According to the current technology level, the expansion strain and rotation strain can be removed by a correcting function of the stepper itself. Therefore, a cause which may actually lower the overlay accuracy is principally the field strain of the stepper. This field strain maintains a substantially constant value when exposure is carried out with the same stepper and under the same optical conditions (numerical aperture and lighting conditions). Therefore, a difference in field strain between first and second patterns is sufficiently small, when the first pattern is formed on a semiconductor substrate with a first stepper under first optical conditions and the second pattern is formed with the same stepper under the same optical conditions, so that any problem impeding high integration does not arise.

However, a difference in field strain causes a problem when different steppers are used and/or different optical conditions are used.

FIG. 18 is a schematic view of a first stepper for showing a field strain. Referring to FIG. 18, a first stepper 1102 includes a light source 1103, a photomask 1105, a reducing lens 1106 and a stage 1108. Light source 1103 emits KrF laser beams represented by arrows 1104. Photomask 1105 is provided with a predetermined mask pattern 1105a. Reducing lens 106 converges the KrF laser beams. A wafer 1107 is laid on stage 1108.

In this first stepper 1102 thus constructed, the KrF laser beams emitted from light source 1103 and represented by arrows 1104 pass through a portion of photomask 1105 not provided with mask pattern 1105a. The KrF laser beams passed through photomask 1105 are converged by reducing lens 1106, and thereafter reach wafer 1107.

FIG. 19 is a plan taken along line XIX—XIX in FIG. 18. Referring to FIG. 19, the KrF laser beams represented by arrows 1104 are radiated to wafer 1107 on stage 1108. Deviations or shifts of magnitudes and directions indicated by arrows 1109 occur between ideal pattern positions, which are determined by an ideal mask and an ideal optical system, and actual pattern positions, which are determined by an ideal mask but by an actual optical system. It is assumed that these deviations do not contain deviations caused by parallel movement, rotation, extraction and contraction. The deviations represented by arrows 1109 are called field strains.

FIG. 20 is a schematic view of a second stepper for showing the field strains. Referring to FIG. 20, a second stepper 1202 includes a light source 1203, photomask 1105, a reducing lens 1206 and a stage 1208. Light source 1203 emits KrF laser beams represented by arrows 1104. Reducing lens 1206 converges the KrF laser beams represented by arrows 1104. Wafer 1107 is disposed on stage 1208. Second stepper 1202, light source 1203, reducing lens 1206 and stage 1208 are different from first stepper 1102, light source 1103, reducing lens 1106 and stage 1108 shown in FIG. 18, respectively. The KrF laser beams represented by arrows 1104 in FIG. 20, photomask 1105, mask pattern 1105a and wafer 1107 are the same as the KrF laser beams represented by arrows 1104 in FIG. 18, photomask 1105, mask pattern 1105a and wafer 1107, respectively. The KrF laser beams represented by arrows 1104 and emitted from light source 1203 pass through a portion of photomask 1105 not provided with mask pattern 1105a. The KrF laser beams passed through photomask 1105 are converged by reducing lens 1206, and thereafter reach wafer 1107 on stage 1208.

FIG. 21 is a plan taken along line XXI—XXI in FIG. 20. Referring to FIG. 21, wafer 1107 is laid on stage 1108. The KrF laser beams represented by arrows 1104 are radiated to wafer 1107. Similarly to the foregoing case, field strains of magnitudes and directions indicated by arrows 1110 occur between ideal pattern positions and actual pattern positions. Therefore, a positional relationship between the patterns formed by first and second steppers 1101 and 1202 contains an error with respect to an ideal positional relationship. This error is a difference between the field strain caused by first stepper 1102 and the field strain caused by second stepper 1202, and is represented by arrows 1111. The difference between these field strains may have a magnitude of up to about 0.05 $\mu$m according to the current accuracy of steppers.

FIG. 22A is a plan showing a conventional interconnection pattern. FIG. 22B shows, on an enlarged scale, a portion surrounded by line B in FIG. 22A. FIG. 22C is a cross section taken along line XXIIC—XXIIC in FIG. 22B. Referring to FIGS. 22A–22C, an interlayer film 2001 is formed on a wafer 2000. An interconnection layer 2002 is buried in interlayer film 2001. A hole 2003 reaching wafer 2000 is formed at interlayer film 2001. Hole 2003 is not in contact with interconnection layer 2002. If interconnection layer 2002 and hole 2003 were formed at ideal positions with ideal sizes, a distance W in FIG. 22C between hole 2003 and interconnection layer 2002 would be 0.1 $\mu$m.

However, an error in size occurs in processes of etching interconnection layer 2002 and forming hole 2003. Therefore, distance W cannot be smaller than about 0.06 $\mu$m even if they are formed at ideal positions. The foregoing field strain difference represented by arrow 1111 is about 0.05 $\mu$m. Therefore, if the pattern positions move due to this difference in the structure where the distance between the patterns is already reduced due to a work error, the distance W may be reduced to about 0.01 $\mu$m.

In the actual process, deviation of up to about 0.05 $\mu$m may occur due to parallel movement and/or extraction (or contraction) caused by errors in detection of a base mark and movement of stage. If this deviation is added to the foregoing error, hole 2003 is brought into contact with interconnection layer 2003. Therefore, it may now be difficult to provide overlaid fine patterns with different steppers.

In order to overcome the above problems, the same stepper may be used to provide overlaid layers, i.e., a first layer to be formed according to a first resist pattern and a second layer to be formed on the first layer according to a second resist pattern. In this case where all the layers are formed by the same stepper, such problems arise that the required steppers increase in number and a processing time increases.

Even if the same stepper is used, the first and second layers may be formed under different optical conditions. In this case, a relative difference occurs between the field strain of the stepper in the process of forming the first layer and the field strain of the stepper in the process of forming the second layer. For example, the interconnection layer may be formed by radiation of high σ rays, and the hole layer may be formed by radiation of low σ rays. In this case, it has been found that overlay deviation of up to about 0.03 μm occurs due to a relative difference between the field strains. Therefore, it is impossible to improve the overlay accuracy.

SUMMARY OF THE INVENTION

Accordingly, the invention has been developed to overcome the above problems, and it is an object of the invention to provide a method and an apparatus for forming a photomask, wherein a first resist pattern and a second resist pattern on the first resist pattern can be formed without an influence by field strains. Here, the field strain is defined as "a deviation between an ideal pattern position, which is determined by an ideal mask and an ideal optical system, and an actual pattern position, which is determined by an ideal mask but by an actual optical system".

Another object of the invention is to provide a method and an apparatus for manufacturing a photomask, which allow overlaying of first and second layers with high accuracy.

An object of the present invention is to provide a method of manufacturing a semiconductor device in which patterns with high overlay accuracy are formed.

A method of manufacturing a photomask according to the invention includes the following steps (1)–(6).

(1) Forming first resist patterns of N in number on a semiconductor substrate using a mask provided with standardized mask patterns of N in number.

(2) Forming second resist patterns of N in number with a mask located at a position shifted in a predetermined direction by a predetermined distance from a relative position of the mask in the step of forming the first resist patterns with respect to the semiconductor substrate.

(3) Measuring N deviation quantities of the resist pattern positions by comparing the N first resist patterns with the N second resist patterns.

(4) Calculating N quantities for shifting the mask pattern positions for the N standardized mask patterns based on the N deviation quantities of the resist pattern positions, respectively.

(5) Calculating M quantities for shifting drawing fields from the quantities for shifting the mask pattern positions in drawing units for drawing the mask patterns.

(6) Drawing the predetermined mask patterns on a mask substrate by shifting the positions of the M drawing fields in drawing units in accordance with the M quantities for shifting the drawing fields, respectively.

According to the method of manufacturing the photomask of the invention including these steps, a relative deviation between the first and second resist patterns formed with the same mask can be measured for N points in the step (3). Then, in the steps (4) and (5), the M quantities for shifting the drawing fields can be calculated from the N deviation quantities of the resist pattern positions measured in the step (3) to cancel the deviation quantities of the resist pattern positions. In the step (6), the positions of the drawing fields are shifted in accordance with the calculated quantities for shifting the drawings fields and the mask patterns can be drawn on the mask substrate. Therefore, even when there is a difference between the field strain caused under the conditions for forming the first resist patterns and the field strain caused under the conditions for forming the second resist patterns, the photomask can be manufactured without an influence by this difference. Accordingly, the method of manufacturing the photomask of the invention can provide the photomask allowing formation of layers overlaid with each other with high accuracy.

Preferably, the step of forming the first resist patterns includes the step of forming the first resist patterns with a first reducing projection exposure device having the mask set therein, and the step of forming the second resist patterns includes the step of forming the second resist patterns with a second reducing projection exposing device having the same mask set therein. In this case, a difference in strain between the first and second reducing projection exposing devices, which form the first and second resist patterns, respectively, forms the deviation quantities of the N resist pattern positions measured in the step (3). According to the steps (4)–(6), it is possible to manufacture the photomask (I) without an influence of a difference in field strain which occurs due to change in the conditions for forming the resist patterns. According to this method, therefore, it is possible to produce the photomask allowing formation of layers overlaid with high accuracy, even if different reducing projection exposing devices are used.

Preferably, the step of forming the first resist patterns includes the step of forming the first resist patterns with a reducing projection exposing device under first optical conditions, and the step of forming the second resist patterns includes the step of forming the second resist patterns with the same reducing projection exposing device under second optical conditions. In this case, the deviation quantity of the N resist pattern positions measured in the step (3) is the difference between the field strains caused by change in optical conditions. According to the steps (4)–(6), it is possible to manufacture the photomask (II) without an influence by the difference between the field strains caused by change in the conditions for forming the resist patterns. According to this method, therefore, it is possible to manufacture the photomask allowing formation of overlaid layers with high accuracy.

Preferably, the step of calculating the quantity for shifting the drawing field includes calculation of the quantity for shifting at a center of each of the drawing fields. In this case, the deviation of the position at the center of the drawing field is zero, and the deviation gradually increases as the position moves away from the center. In the case where the quantity for shifting the drawing field at one end of the drawing field is calculated, the quantity for shift is zero at the one end, and is large at the other end. In the case where the quantity for shifting is calculated at the center of the drawing field is calculated, the quantities for shift are relatively uniform compared with the case where the quantity for shift is calculated at the end of the drawing field, so that multiple layers can be overlaid with high accuracy using a simple calculating program.

An apparatus for manufacturing a photomask according to the invention includes arithmetic processing means, drawing control means, data converting means and stage control means.

Comparison is made between each of N first resist patterns and each of N second resist patterns to determine N deviation quantities of resist pattern positions. Here, the N first resist patterns are formed on a semiconductor substrate using a mask provided with N standardized mask patterns. The N second resist patterns are formed on the semiconductor substrate by setting the mask at a position shifted in a predetermined direction by a predetermined distance from the relative position of the mask with respect to the semiconductor substrate during formation of the first resist patterns. The arithmetic processing means calculates the N quantities for shifting the mask pattern positions required for the positions of the N standardized mask patterns based on the N deviation quantities of the resist pattern positions, respectively.

The drawing control means receives the quantities for shifting the mask pattern positions supplied from the arithmetic processing means. The data converting means is arranged at the drawing control means, and calculates the M quantities for shifting drawing fields in drawing units for drawing the mask patterns from the quantities for shifting the mask pattern positions.

The stage control means moves the mask substrate to allow drawing of predetermined mask patterns on the mask substrate by shifting the positions of the M drawing fields in drawing units in accordance with the M quantities for shifting the drawing fields received from the drawing control means, respectively.

According to the apparatus for manufacturing the photomask of the invention thus constructed, the N deviation quantities of the resist pattern positions are measured between the first and second resist patterns, respectively. The deviation quantities of the resist pattern positions are the differences between the field strains caused under the conditions for forming the first resist patterns and the field strains caused under the conditions for forming the second resist patterns. Then, the arithmetic processing means, drawing control means and data converting means can operate to calculate the quantities for shifting the drawing fields to reduce the N deviation quantities of the resist pattern positions. Then, the stage control means moves the mask substrate in accordance with the quantities for shifting the drawing fields to manufacture the photomask. Therefore, even if there is a difference between the field strains caused under the conditions for forming the first resist patterns and the field strains caused under the conditions for forming the second resist patterns, the photomask without an influence by this difference can be manufactured. Therefore, the apparatus for manufacturing the photomask of this invention can manufacture the photomask allowing formation of layers overlaid with high accuracy.

In the method of manufacturing a semiconductor device in accordance with one aspect of the present invention, patterns having overlay accuracy of at most 0.15 $\mu$m are formed, and the method includes the steps of forming a first pattern on a semiconductor substrate by using a first reducing projection exposure device, and forming a second pattern overlaid on the first pattern by using a second reducing projection exposure device different from the first reducing projection exposure device. Here, overlay accuracy refers to deviation between the first pattern and the second pattern formed on the first pattern.

When a photomask (I) manufactured through the above described steps in the method of manufacturing the semiconductor device having the above described steps is used, a semiconductor device can be manufactured in which patterns having high overlay accuracy can be formed even when different reducing projection exposure devices are used.

The method of manufacturing a semiconductor device in accordance with another aspect of the present invention is to form patterns with overlay accuracy of at most 0.15 $\mu$m, including the steps of forming a first pattern under a first optical condition on a semiconductor substrate by using a reducing projection exposure device, and forming a second pattern overlaid on the first pattern under a second optical condition different from the first optical condition using the reducing projection exposure device.

When a photomask (II) manufactured through the above described steps of the method of manufacturing the semiconductor device having these steps is used, a semiconductor device having patterns with high overlay accuracy can be formed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 shows deviation quantities of resist pattern positions;

DESCRIPTION OF THE PREFERRED EMBODIMENTS

Embodiments of the invention will be described below with reference to the drawings. Measuring means which will be described later is not included in the manufacturing apparatus of the invention.

Figure 1:
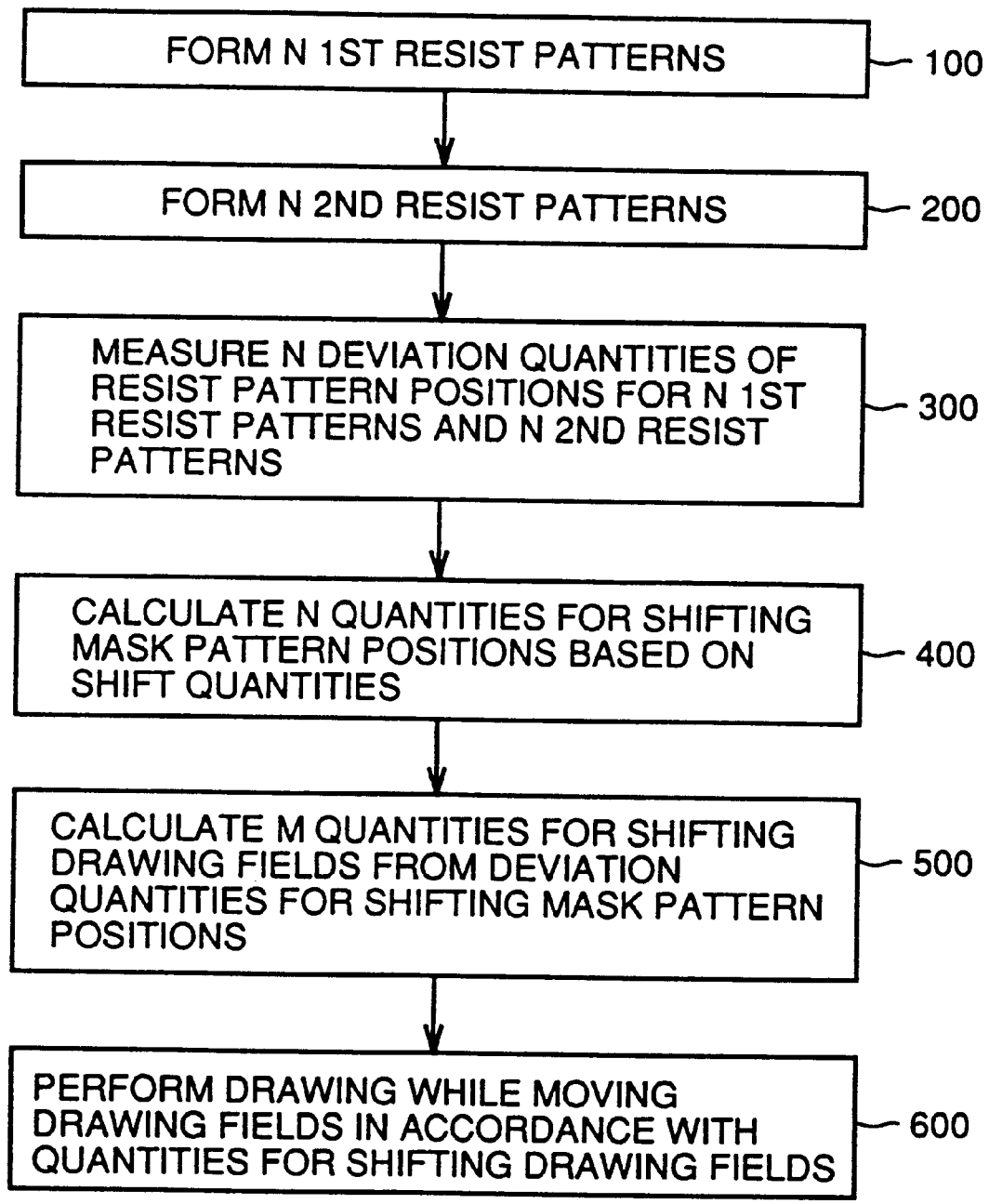
FIG. 1 shows steps of manufacturing a photomask according to the invention.
Figure 2:
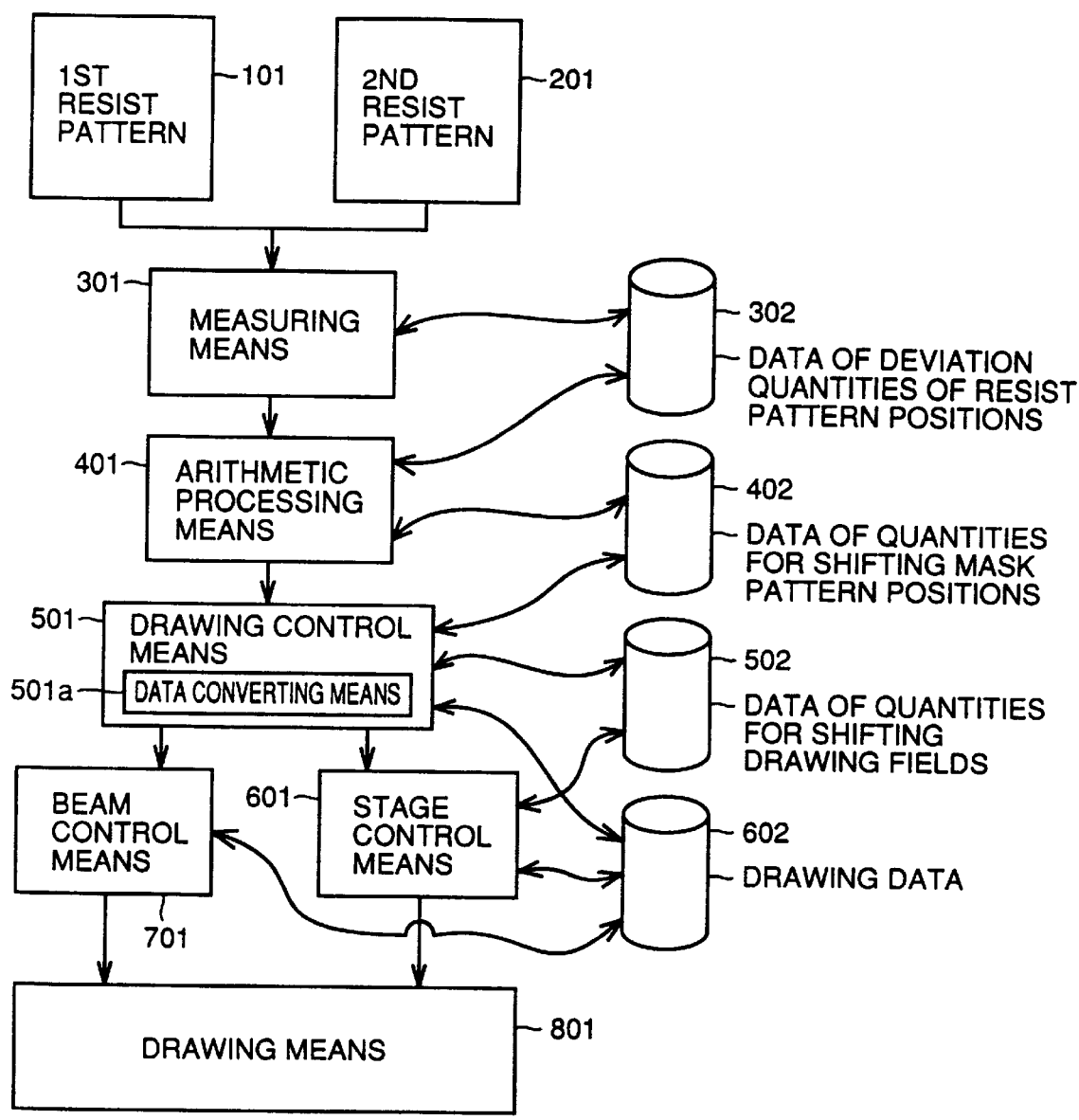
FIG. 2 is a block diagram showing a structure of a photomask manufacturing apparatus according to the invention.

Referring to FIGS. 1 and 2, first resist patterns 101 of N in number are formed on a wafer with a mask (step 100).

Then, the mask is shifted by a predetermined distance from a position of the mask used for forming first resist patterns 101, and second resist patterns 201 of N in number are formed on the wafer (step 200). In this processing, second resist patterns 201 are formed with the same mask as that used for forming first resist patterns 101. Second resist patterns 201 thus formed partially overlap with first resist patterns 101. A stepper for forming first resist patterns 101 is different from that for forming second resist patterns 201.

N first resist patterns 101 are compared with N second resist patterns 201, respectively, whereby measuring means 301 measures and obtains data 302 of N deviation quantities of the resist pattern positions (step 300). Measuring means 301 is not included in the manufacturing apparatus of the invention.

Then, arithmetic processing means 401 receives data 302 of the deviation quantities of resist pattern positions from measuring means 301, and calculates data 402 of N quantities for shifting the mask pattern positions (step 400).

Drawing control means 501 receives data 402 of the quantities for shifting the mask pattern positions from arithmetic processing means 401. Data converting means 501a provided at drawing control means 501 calculates, from data 402 of the quantities for shifting the mask pattern position, data 502 of M quantities required for shifting drawing fields in drawing units in the process of drawing the mask pattern (step 500). The quantity for shifting the drawing field is calculated as the quantity for shifting a center of each drawing field. Drawing control means 501 receives drawing data 602.

Then, stage control means 601 receives, from drawing control means 501, data 502 of quantity for shifting the drawing fields as well as drawing data 602, and shifts the M drawing fields in drawing units in accordance with the M quantities for shifting the drawing fields to move the mask substrate, respectively. Beam control means 701 receiving drawing data 602 from drawing control means 501 controls the intensity and direction of the beams. Drawing means 801 receiving instructions from stage control means 601 and beam control means 701 draws the mask pattern on the mask substrate (step 600).

Steps 100 to 600 shown in FIG. 1 will now be described below in detail.

First, step 100 in FIG. 1 will be described below.

Figure 3:
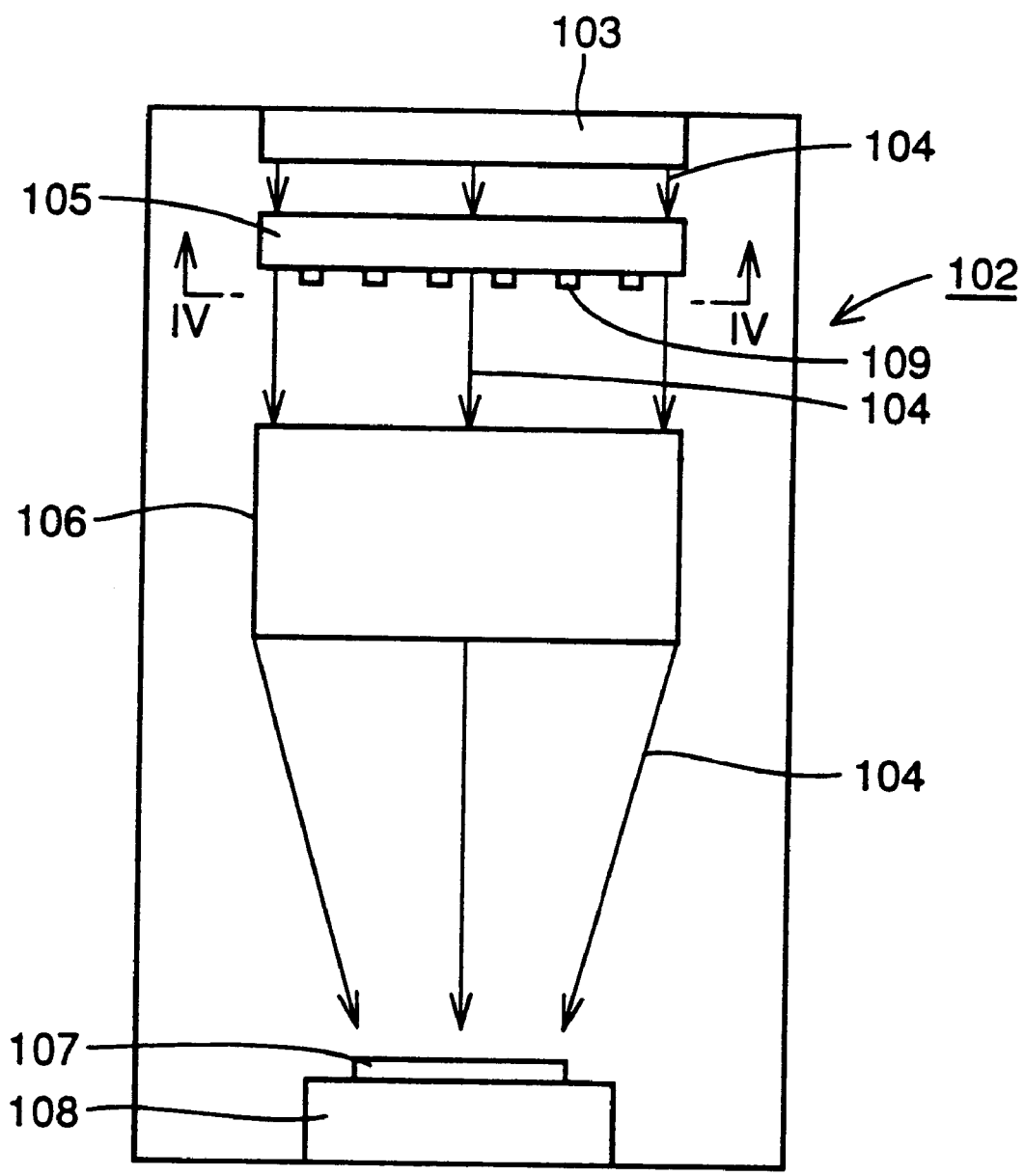
FIG. 3 is a schematic view of a stepper for showing a step 100.

Referring to FIG. 3, a first stepper 102 includes a light source 103, a photomask 105, a reducing lens 106 and a stage 108.

A light source 103 emitting KrF laser beams having a wavelength of 248 nm is arranged at the upper portion of first stopper 102. Photomask 105 is made of a glass substrate, and is provided at its lower surface with a mask pattern 109 made of chrome. Photomask 105 is disposed immediately under light source 103. Reducing lens 106 is disposed immediately under photomask 105. Reducing lens 106 converges incident light beams. Stage 108 is disposed under reducing lens 106. Stage 108 is movable in the same plane. Wafer 107 is disposed on stage 108.

KrF laser beams represented by arrows 104 pass through a portion of photomask 105 not provided with mask pattern 109, and reach reducing lens 106. The light beams passed through reducing lens 106 converge and reach wafer 107 on stage 108. Therefore, an image of mask pattern 109 formed at photomask 105 is transferred onto wafer 107, so that first resist patterns 101 of N (=$n^2$) in number are formed on wafer 107.

Figure 4:
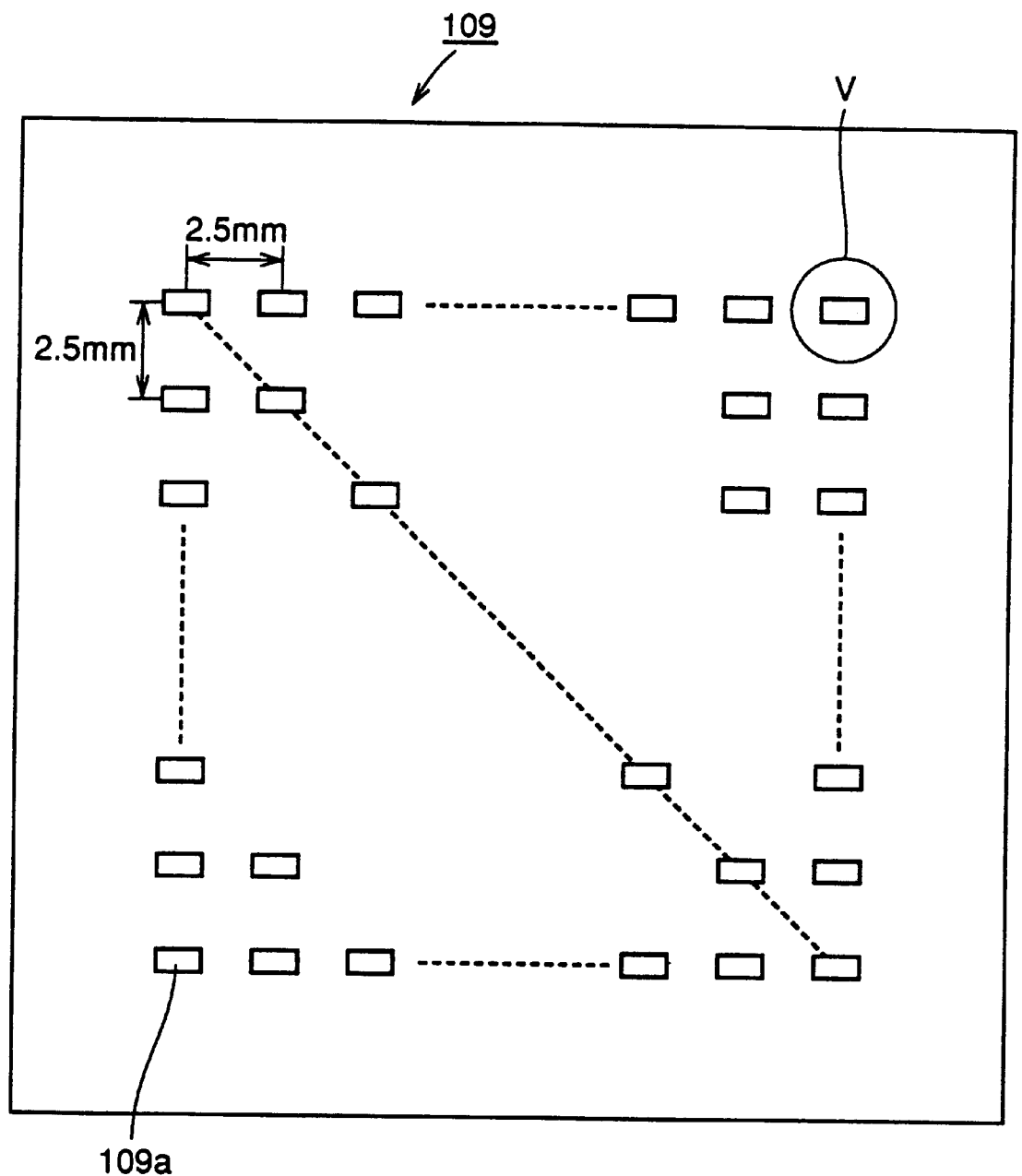
FIG. 4 is a plan taken along line IV—IV in FIG. 3.

Referring to FIG. 4, photomask 105 is provided with metal patterns 109a of n (=22) in the X direction by n (=22) in the Y direction, i.e., $n^2$ (=484) in total number spaced from each other by 2.5 mm in the x and Y directions.

Figure 5:
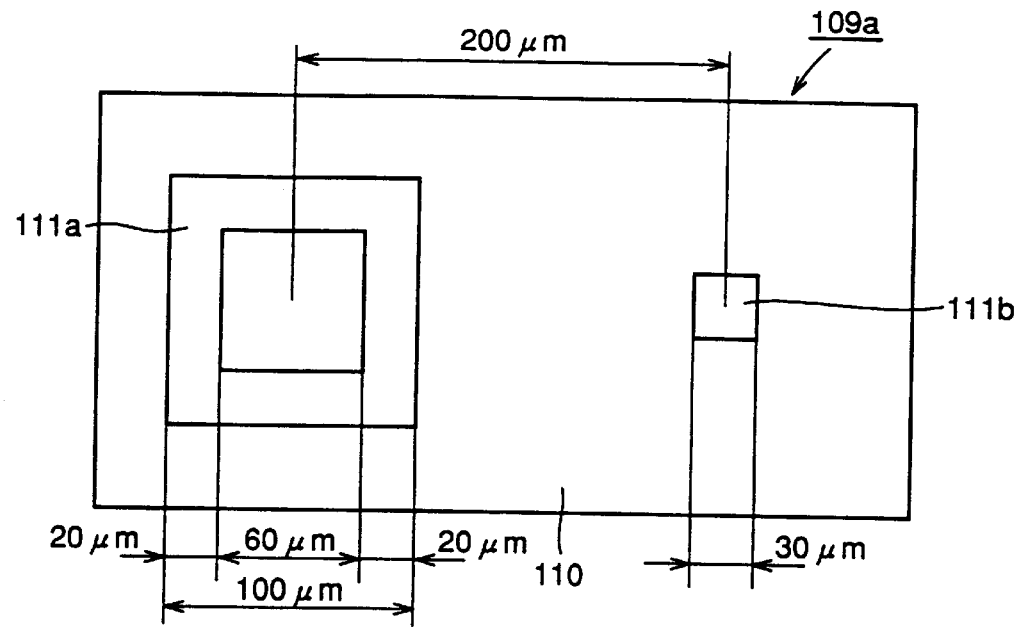
FIG. 5 is a plan showing, on an enlarged scale, a portion indicated by V in FIG. 4.

Metal patterns 109a will be described below more in detail. Referring to FIG. 5, metal pattern 109a includes a metal portion 110 made of chrome and transparent portions 111a and 111b which do not contain chrome and allows passage of light beams. Each metal pattern 109a includes two transparent portions 111a and 111b. Centers of transparent portions 111a and 11b are spaced by a distance of 200 μm. Specific sizes of transparent portions 111a and 111b are shown in FIG. 5. Only the light beams which pass through transparent portion 111a or 111b reach wafer 107.

Figure 6:
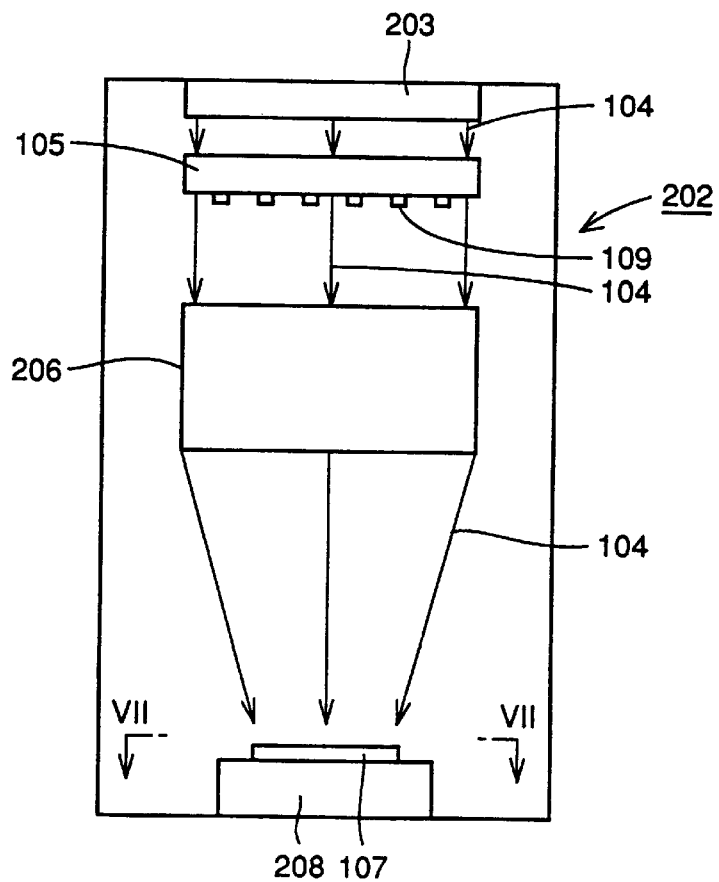
FIG. 6 is a schematic view of a stepper for showing a step 200.

A step 200 will be described below. Referring to FIG. 6, a second stepper 202 includes a light source 203, a photomask 105, a reducing lens 206 and a stage 208.

Light source 203 is arranged at the upper portion of stepper 202, and emits KrF laser beams having a wavelength of 248 nm as represented by arrows 104. Reducing lens 206 converges the light beams. The stage 208 is movable in the same plane. Wafer 107 is laid on stage 208.

The second stepper 202, light source 203, reducing lens 206 and stage 208 are different from first stepper 102, light source 103, reducing lens 106 and stage 108 shown in FIG. 3, respectively. Photomask 105 and wafer 107 in FIG. 6 are the same as photomask 105 and wafer 107 in FIG. 3. Although wafer 107 in FIG. 3 is located immediately under photomask 105 in FIG. 3, wafer 107 in FIG. 6 is shifted by a predetermined distance from a position immediately under photomask 105 in FIG. 6.

In second stepper 202 thus constructed, KrF laser beams represented by arrows 104 emitted from light source 203 pass through a portion of photomask 105 not provided with mask pattern 109. The light beams passed through photomask 105 pass through reducing lens 206 converge and reach wafer 107. Since wafer 107 is shifted by the predetermined distance from photomask 105, images of metal patterns 109a are transferred onto positions at first photosensitive portion 111 on wafer 107 shifted by a predetermined distance. In this manner, second resist patterns 201 are formed.

Figure 7:
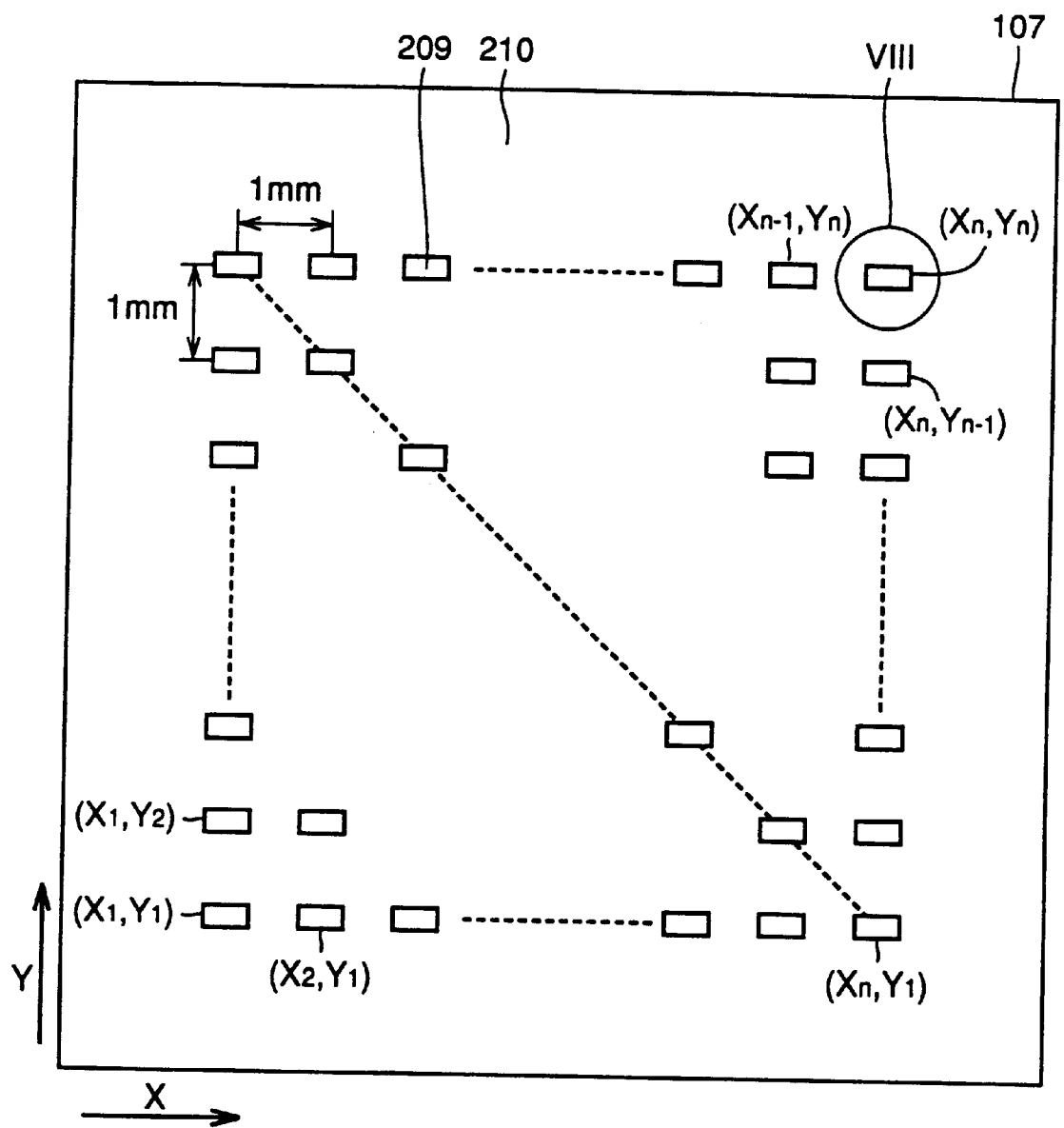
FIG. 7 is a plan taken along line VII—VII in FIG. 6.

Referring to FIG. 7, wafer 107 is coated with resist 210. Resist patterns 209, which are n in the X direction by Y in the Y direction, i.e., $n^2$ in total number and each are formed of first and second resist patterns 101 and 201 formed in the foregoing manner, are formed on resist 210. The positions of resist patterns 209 in FIG. 7 will be represented by coordinates hereinafter. For example, the position of resist pattern 209 located at a lower left position in FIG. 7 is represented by coordinates $(X_1, Y_1)$. A position of resist pattern 209 locate at an upper right position in FIG. 7 is represented by coordinates $(X_n, Y_n)$.

Figure 8:
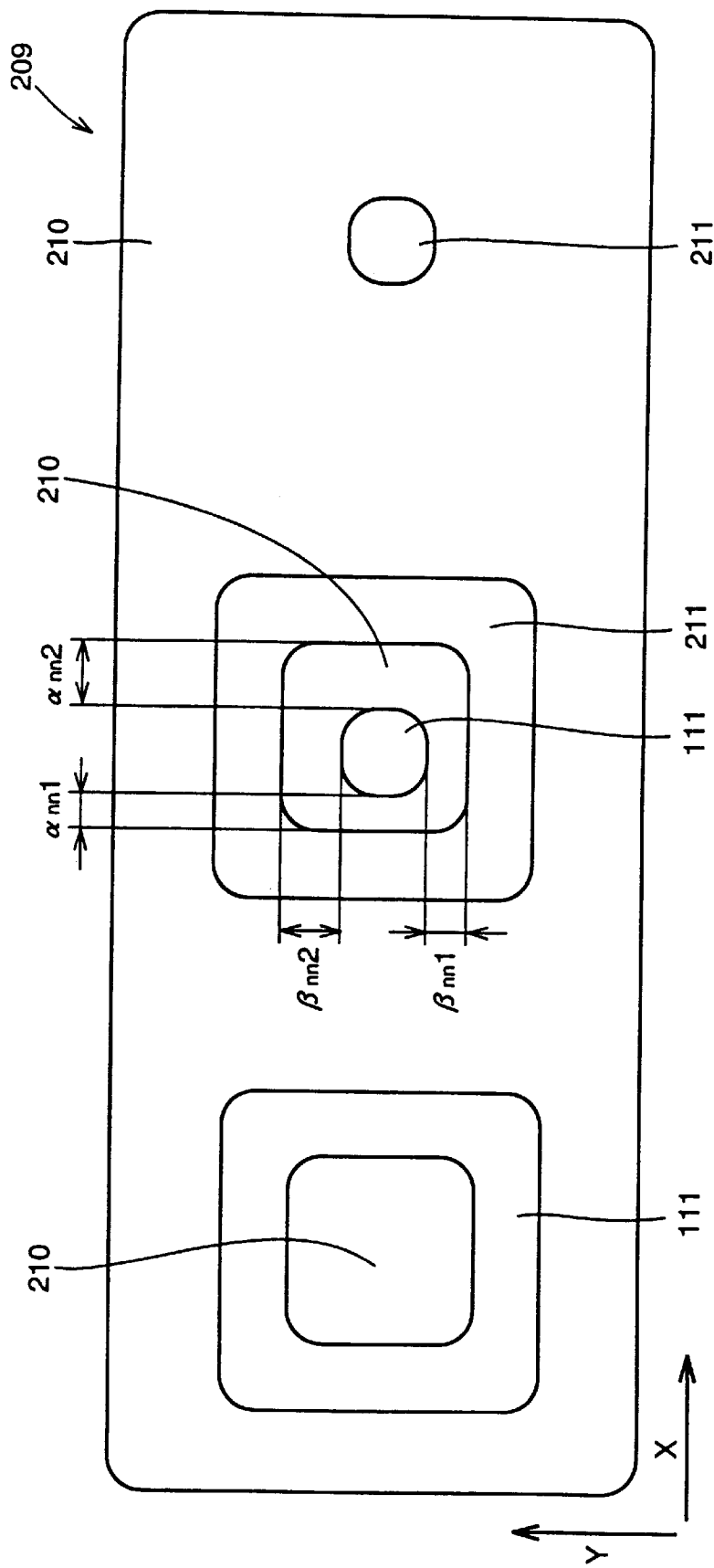
FIG. 8 is a plan showing, on an enlarged scale, a portion indicated by VII in FIG. 7.

Resist pattern 209 will be described below in detail. Referring to FIG. 8, resist pattern 209 includes unexposed resist 210, first exposed portions 111 exposed in the step shown in FIG. 3, and second exposed portions 211 exposed in the step shown in FIG. 6.

First resist pattern 101 in FIG. 2 corresponds to first exposed portion 111, and second resist pattern 201 corresponds to second exposed portion 211. In the step shown in FIG. 6, photomask 105 is set to shift second exposed portion 211 by 200 μm from first exposed portion 111. In practice, however, it does not shift accurately by 200 μm due to field strains at second stepper 202. Accordingly, in a portion where first exposed portion 111 is formed within second exposed portion 211, deviations represented by $\alpha_{nn}1$ and $\alpha_{nn}2$ in FIG. 8 occur in the X direction between first and second exposed portions 111 and 211. In the Y direction, shifts represented by $\beta_{nn}1$ and $\beta_{nn}2$ occur. Both of first and second exposed portions 111 and 211 are formed of exposed resist.

Then, step 300 will be described below. For N resist patterns 209, one of which is shown in FIG. 8, calculation is performed to obtain $\alpha_{nn}1$, $\alpha_{nn}2$, $\beta_{nn}1$ and $\beta_{nn}2$ based on an image by an SEM (Scanning Electron Microscope). From these values, N (=$n^2$) resist pattern position deviation quantities $\Delta_{nn}$ are calculated by the following formula (1).

$$\Delta_{nn}=(\alpha_{nn}1-\alpha_{nn}2, \beta_{nn}1-\beta_{nn}2) \tag{1}$$

n=1, 2, . . . , n

Figure 10:
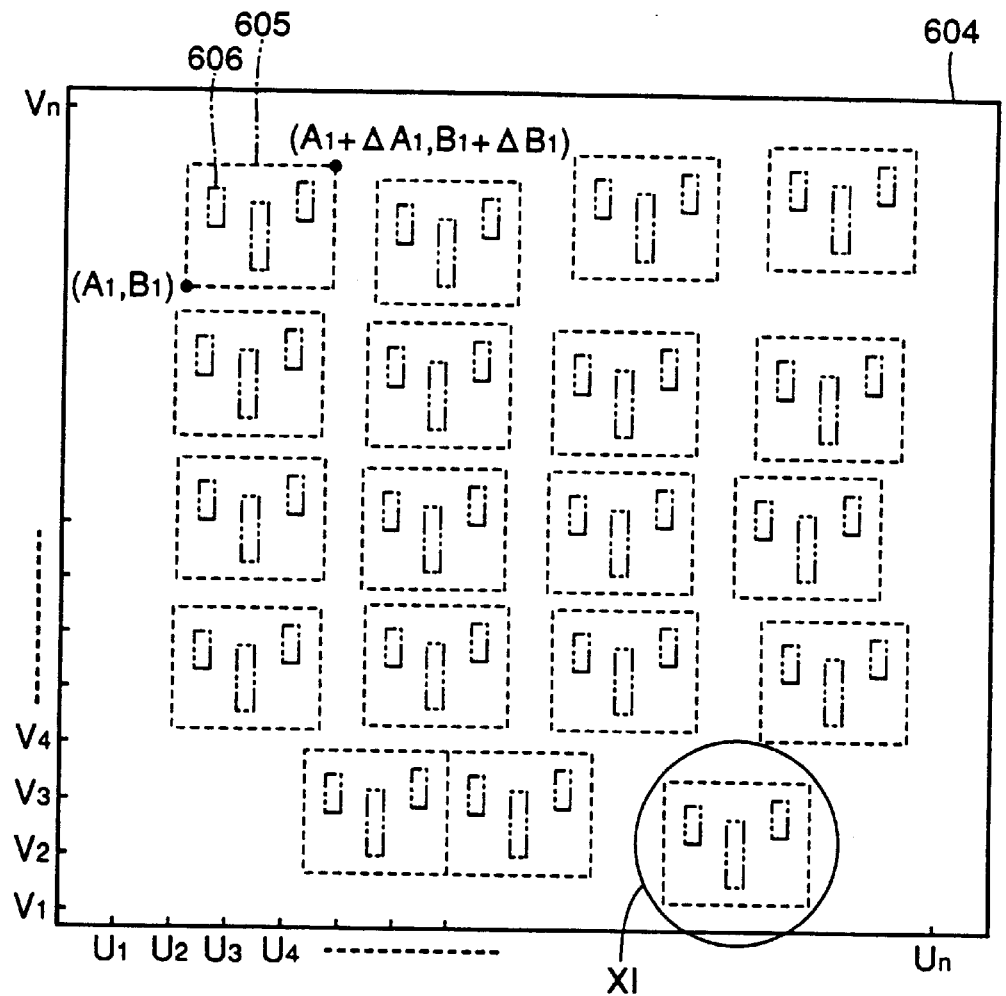
FIG. 10 is a plan of a mask blank.
Figure 11:
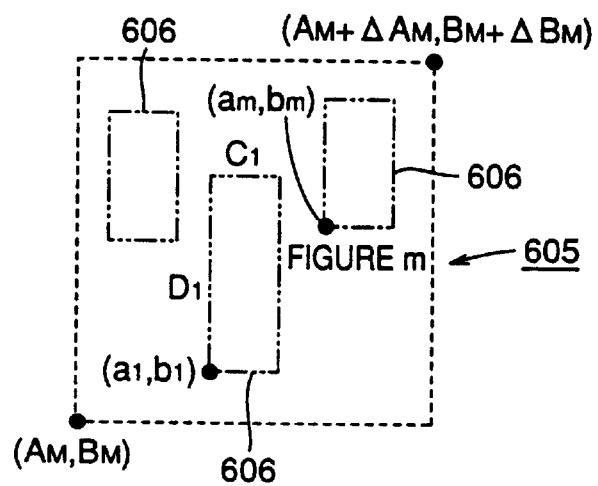
FIG. 11 is a plan showing, on an enlarged scale, a portion indicated by XI in FIG. 10.

As shown in FIG. 9, resist pattern position deviation quantities $\Delta$ are obtained for N resist patterns 209 on the wafer, respectively. Here, $\Delta$hd 11is the resist pattern position deviation quantity at the coordinate $(X_1, Y1)$. $\Delta_{nn}$ is the resist pattern position deviation quantity at the coordinate $(X_n, Y_n)$ Step 400 will be described below. Referring to FIGS. 10 and 11, graphic forms or figures 606 represented by alternate long and two short dashes line are drawn on a mask blank 604. Mask blank 604 is formed of a glass substrate, a chrome layer formed thereon, and a resist layer formed on the chrome layer. Since the resist layer is located at the surface of mask blank 604, electron rays are radiated to the resist layer to draw figures 606. In this process, the electron rays can perform drawing on only one drawing field 605 at a time.

The sizes of drawing field 605 is from 0.5 mm×0.5 mm to 4 mm×4 mm. Therefore, after completion of drawing in one drawing field 605, the stage moves mask blank 604 for drawing figures 606 in next drawing field 605 with electron rays. Here, drawing fields 605 are M in number, and origins of them are represented by coordinates $(A_1, B_1)$–$(A_M, B_M)$.

Each side of the drawing field, of which origin is represented by $(A_1, B_1)$, has a length of $\Delta A_1$ or $\Delta B_1$. In mask blank 604, there are formed a lateral coordinate axis represented by $U_1$–$U_n$ as well as a vertical coordinate axis represented by $V_1$–$V_n$. Coordinate axes U and V correspond to coordinate axes X and Y formed at wafer 107 shown in FIG. 7. Therefore, a relationship expressed by the following formula (2) can be established between coordinates $(U_n, V_n)$ and coordinates $(X_n, Y_n)$ $$(U_n, V_n)=(5X_n, 5Y_n) \tag{2}$$

n=1, 2, . . . , n

The above factor 5 by which $X_n$ and $Y_n$ are multiplied is a ratio between one scale on coordinate axes U and V at mask blank 604 and one scale on coordinate axes X and Y at wafer 107.

Under the above preconditions, distances (u, v) for shifting the mask pattern positions on mask blank 604 are calculated from resist pattern position deviation quantities $\Delta$ obtained in step 300 by the following formula (3).

$$(u(U_n, V_n), v(U_n, V_n))=\{-5\Delta x(X_n, Y_n), -5\Delta y(X_n, Y_n)\} \tag{3}$$

n=1, 2, . . . , n

Figure 12:
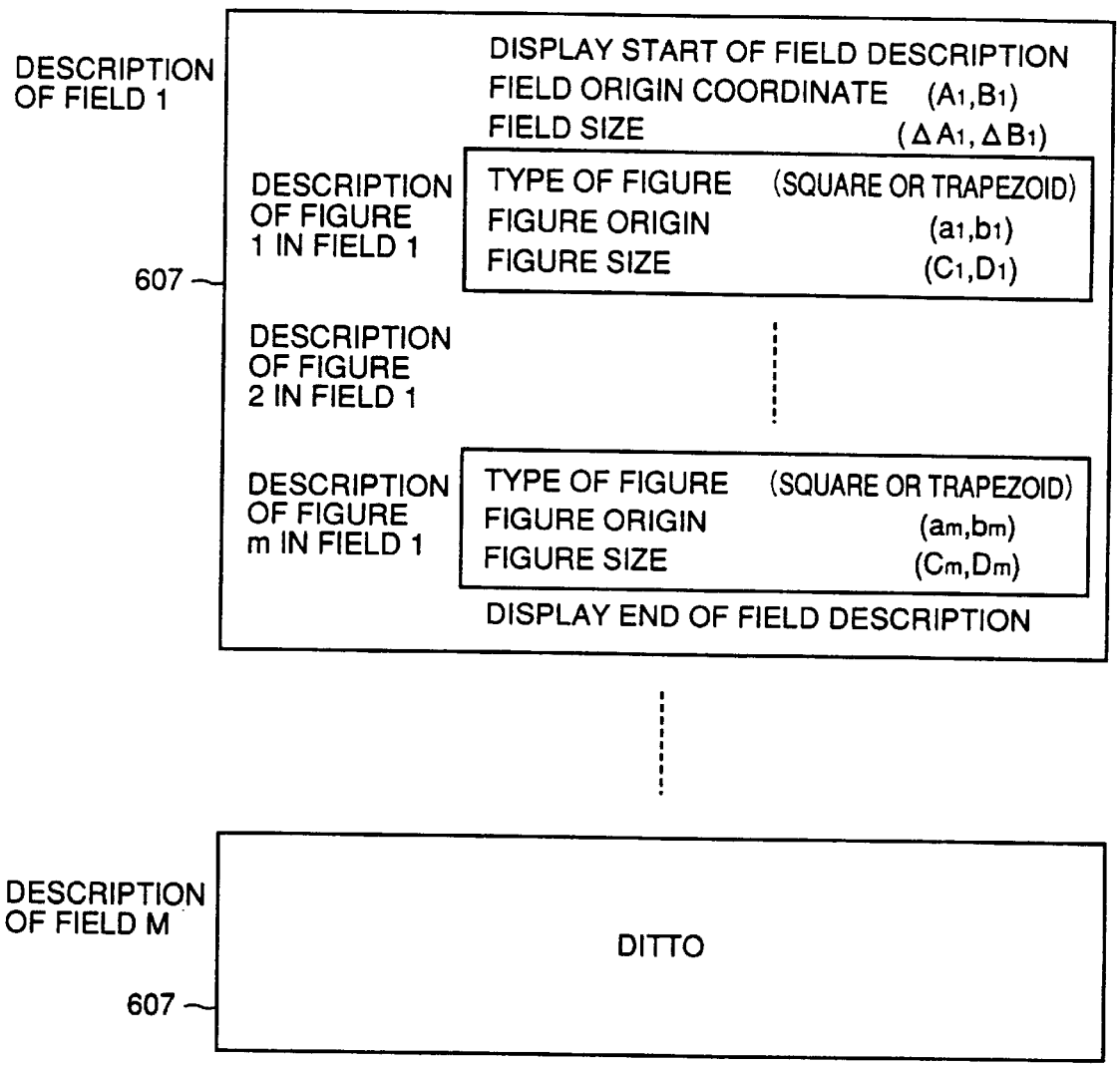
FIG. 12 shows contents of a drawing field.

Step 500 will now be described below. Referring to FIG. 12, since the origin coordinate and the field sizes are determined for each drawing field 605, positions $(W_M, T_M)$ of the drawing field centers are calculated from the following formula (4) with these origin coordinates and field sizes.

$$(W_M, T_M)=((2A_M+\Delta A_M)/2, (2B_M+\Delta B_M)/2) \tag{4}$$

M=1, 2, . . . , M

When drawing field center positions $(W_M, T_M)$ are obtained, the quantities $w_M$, $t_M$ for shifting the drawing fields are calculated by the following formula (5) with these values and the quantities (u, v) for shifting the mask pattern positions obtained at step 400, whereby the corrected positions $(W_M+w_M, T_M+t_M)$ of the field centers are obtained.

$$(W_M+w_M, T_M+t_M) \quad \text{[FORMULA 5]}$$

$W_M$=u($U_j$, $V_k$)+($W_M$–$U_j$)(u($U_{j+1}$, $V_k$)–u($U_j$, $V_k$))/($U_{j+1}$–$U_j$)+($T_M$–$V_j$)(u($U_j$, $V_k$+1)–U($U_j$, $V_k$))/($V_{k+1}$–$V_j$)

$t_M$=v($U_j$, $V_k$)+($W_M$–$U_j$)(v($U_j$+1, $V_k$)–v($U_j$, $V_k$))/($U_{j+1}$–$U_j$)+($T_M$–$V_j$)(v($U_j$, $V_k$+1)–v($U_j$, $V_k$))/($V_{k+1}$–$V_j$)

$U_j<W_M<U_{j+1}$ $V_k<T_M<V_{k+1}$

M=1, 2, . . . , M

Figure 13:
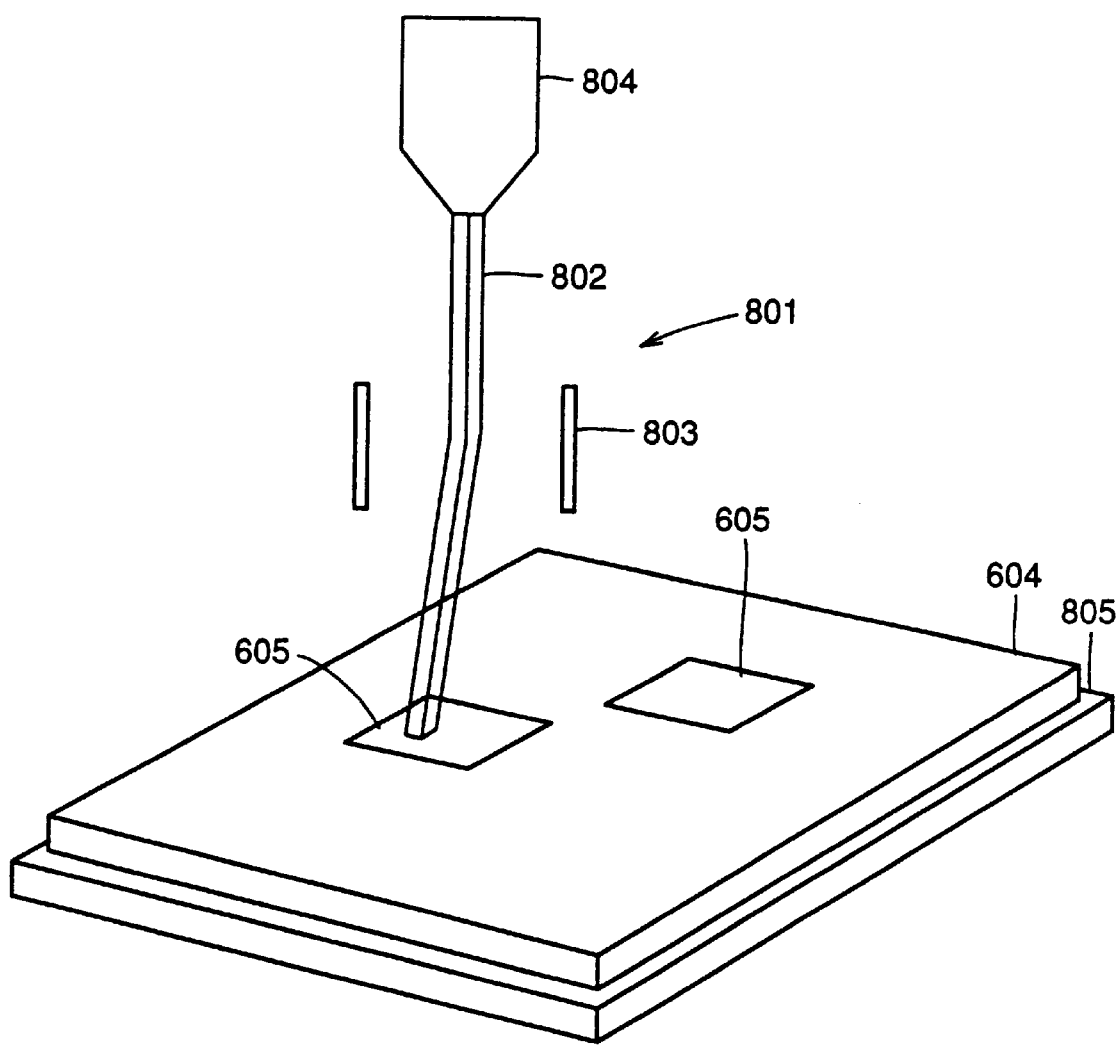
FIG. 13 is a schematic perspective view showing a vector scan EB drawing device.
Figure 14:
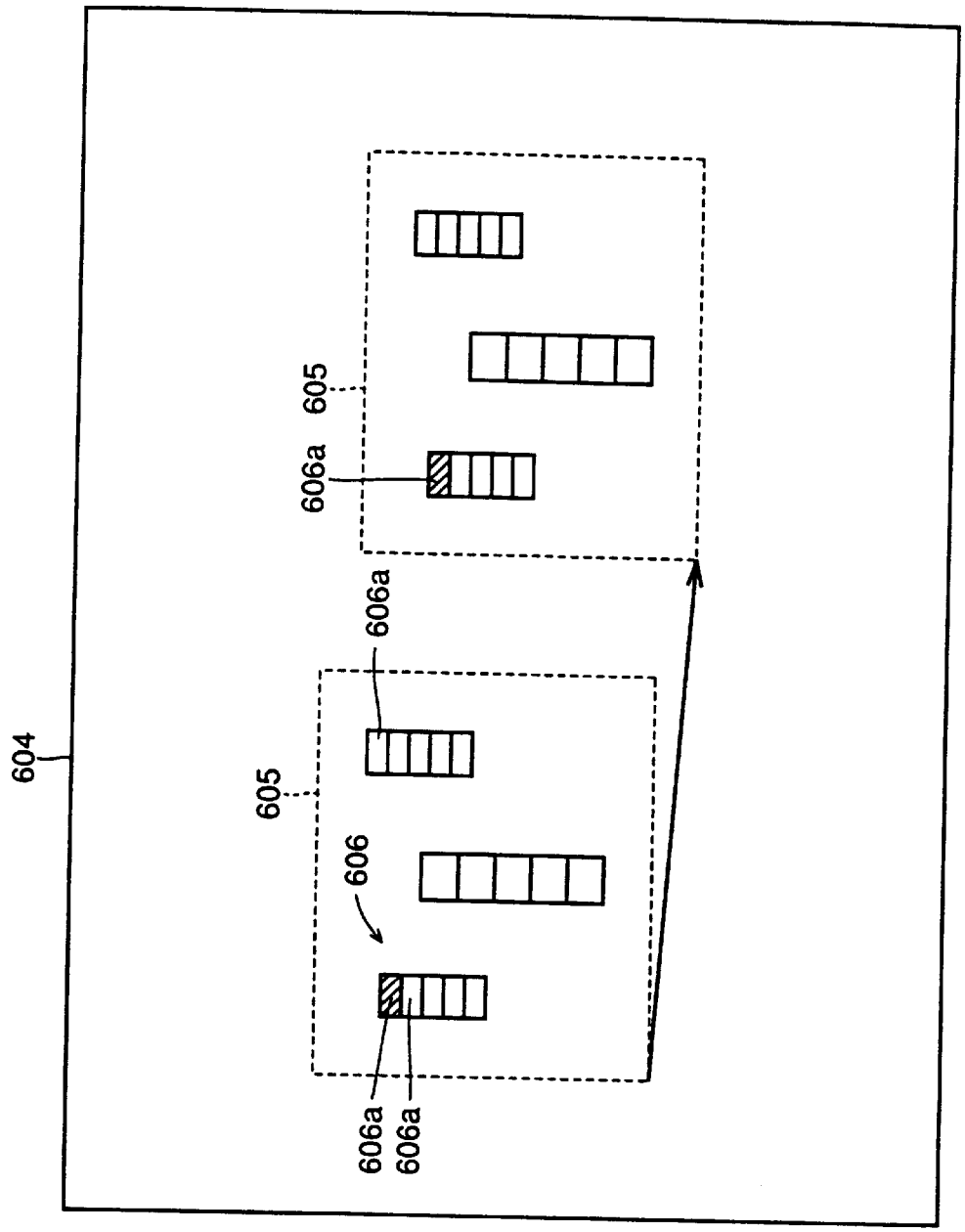
FIG. 14 is a plan of a mask blank for showing a drawing method with the drawing device.

Then, step 600 will be described below. Referring to FIGS. 13 and 14, a vector scan EB drawing device 801 includes deflection electrodes 803, a beam generator 804 and a stage 805.

Beam generator 804 generates square electron beams 802, which reach mask blank 604. Deflection electrodes 803 can change the travel direction of electron beams in accordance with the drawing pattern based on drawing data 602 received from beam control means 701 in FIG. 2. Mask blank 604 is laid on stage 805. Mask blank 604 has a plurality of divided drawing fields 605.

When figure 606 is be drawn in drawing field 605, a center of target drawing field 605 is located immediately under beam generator 804 by stage 805. In this operation, stage 805 moves mask blank 604 in response to signals sent from stage control means 601 in FIG. 2. Stage control means 601 moves stage 805 to locate the corrected center ($W_1+w_1$, $T_1+t_1$) of drawing field 605 obtained in step 500 immediately under beam generator 804.

A plurality of figures 606 are drawn in each drawing field 605. When figures 606 are to be drawn, square electron beams 802 are radiated to one figure unit 606a which can be drawn with one shot of electron beams 802.

When drawing of one figure unit 606a is completed, deflection electrodes 803 change the traveling direction of electron beams 802 to draw another figure unit 606a. In this manner, all figure units 606a are drawn in one drawing field 605.

When drawing of all figure units 606a is completed, stage control means 601 moves stage 805 to locate the corrected center position ($W_2+w_2$, $T_2+t_2$) of next drawing field 605 immediately under beam generator 804 for the subsequent drawing. In this manner, drawing is performed in all of M drawing fields 605. After the drawing, development and etching are effected on mask blank 604, so that the photomask is completed.

In the photomask manufacturing method of the invention including the above steps, the quantities (u, v) for shifting the mask pattern positions are calculated by the formula (3) from deviation quantities Δ between first and second resist patterns on wafer 107. Here, the factor of −5 in the formula (3) is a value obtained by multiplying a ratio of a length of one side of photomask 105 with respect to a length of one side of wafer 107 by −1. Therefore, deviation Δ can be removed by shifting metal pattern 109a by (u, v) in the process of forming second exposed portion 211. In other words, the deviation between the first and second resist patterns can be removed by such a manner that the first resist pattern is formed with a conventional mask, and the second resist pattern is formed with a mask shifted in accordance with the quantity (u, v) for shifting the mask pattern position.

However, the quantities (u, v) for shifting the mask pattern positions on photomask 604 can be obtained only for respective points of N (=$n_2$) in number at a grid form on the photomask. Therefore, in the process of actually drawing the mask, it is necessary to obtain the quantities for shifting the mask pattern positions at reference points in the drawing operation from these N quantities for shifting the mask pattern positions.

According to the invention, therefore, the quantity (w, t) for shifting at the center of drawing field is obtained from the quantity (u, v) for shifting the mask pattern position at a point near the reference point in the drawing operation, i.e., at the point near the center of the drawing field. Therefore, the optimum quantity (w, t) for shifting can be obtained. By shifting the center of drawing field based on this quantity (w, t) for shifting, therefore, the photomask can be manufactured with high overlay accuracy.

By carrying out the respective steps shown in FIG. 1 by the apparatus shown in FIG. 2, the photomask with high overlay accuracy can be manufactured easily.

Figure 15:
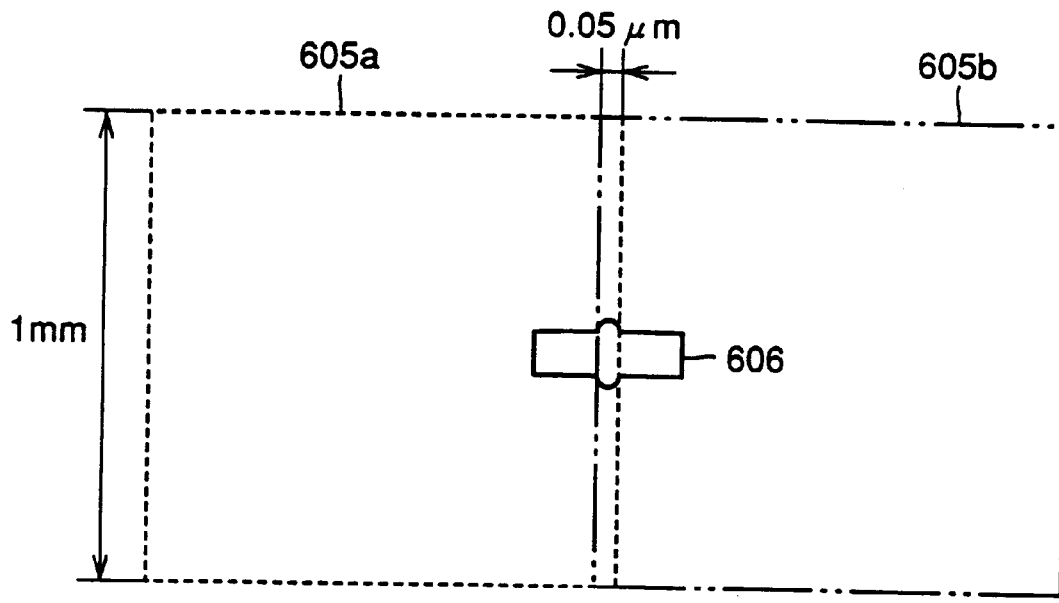
FIG. 15 is a plan showing two drawing fields in contact with each other.

Description will now be given on the case where a figure to be drawn extends over two drawing fields which are in contact with each other. Referring to FIG. 15, a first drawing field 605a surrounded by dotted line is formed on mask blank 604. A second drawing field 605b surrounded by alternate long and two short dashes line is also formed on mask blank 604.

When figure 606 extending over first and second drawing fields 605a and 605b is to be drawn, figure 606 is drawn in first drawing field 605a, and then figure 606 is drawn in second drawing figure 605b after moving mask blank 604.

In this process, second drawing field 605b overlaps with first drawing field 605a even if the position shifting according to the invention is not carried out. A width of this overlapped portions is about 0.05 μm as indicated in FIG. 15. Therefore, a central portion of figure 606 slightly bulges compared with its opposite ends.

Figure 16:
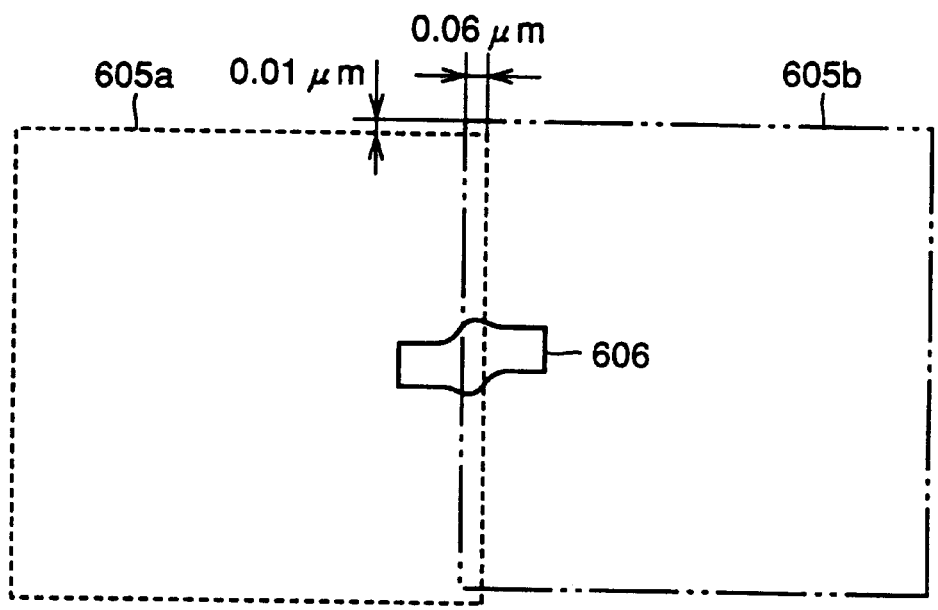
FIG. 16 is a plan showing figures drawn by the invention.

Description will now be given on the case where the invention is applied to the process of drawing the figure shown in FIG. 15. Referring to FIG. 16, figure 606 is first drawn in first drawing field 605a in the case where the invention is applied to the process of drawing figure 606. In this operation, it is assumed that drawing field 605a in FIG. 16 is located at lower right position with respect to drawing field 605a in FIG. 15 owing to correction according to the invention.

Then, figure 606 is drawn in second drawing field 605b. It is assumed that second drawing field 605b in FIG. 16 is located at an upper left position with respect to second drawing field 605b in FIG. 15 as a result of correction. In this case, first and second drawing fields 605a and 605b have overlapped portions of up to about 0.06 μm in width. Thus, when the present invention is applied, the overlapping width increases by about 0.01 μm from that in FIG. 15. This overlapping width can sufficiently fall in an allowable range for the pattern of the order of 0.25 μm.

When first drawing field 605a is shifted leftward and second drawing field 605b was shifted rightward, the overlapping width is about 0.04 μm, and therefore can sufficiently fall in the allowable range. Since the vertical shift distance in FIG. 16 is about 0.01 μm, it is also in the allowable range. Therefore, the invention can be applied even to the case where the figure to be drawn extends over the two drawing fields.

(Embodiment 2)

Figure 17:
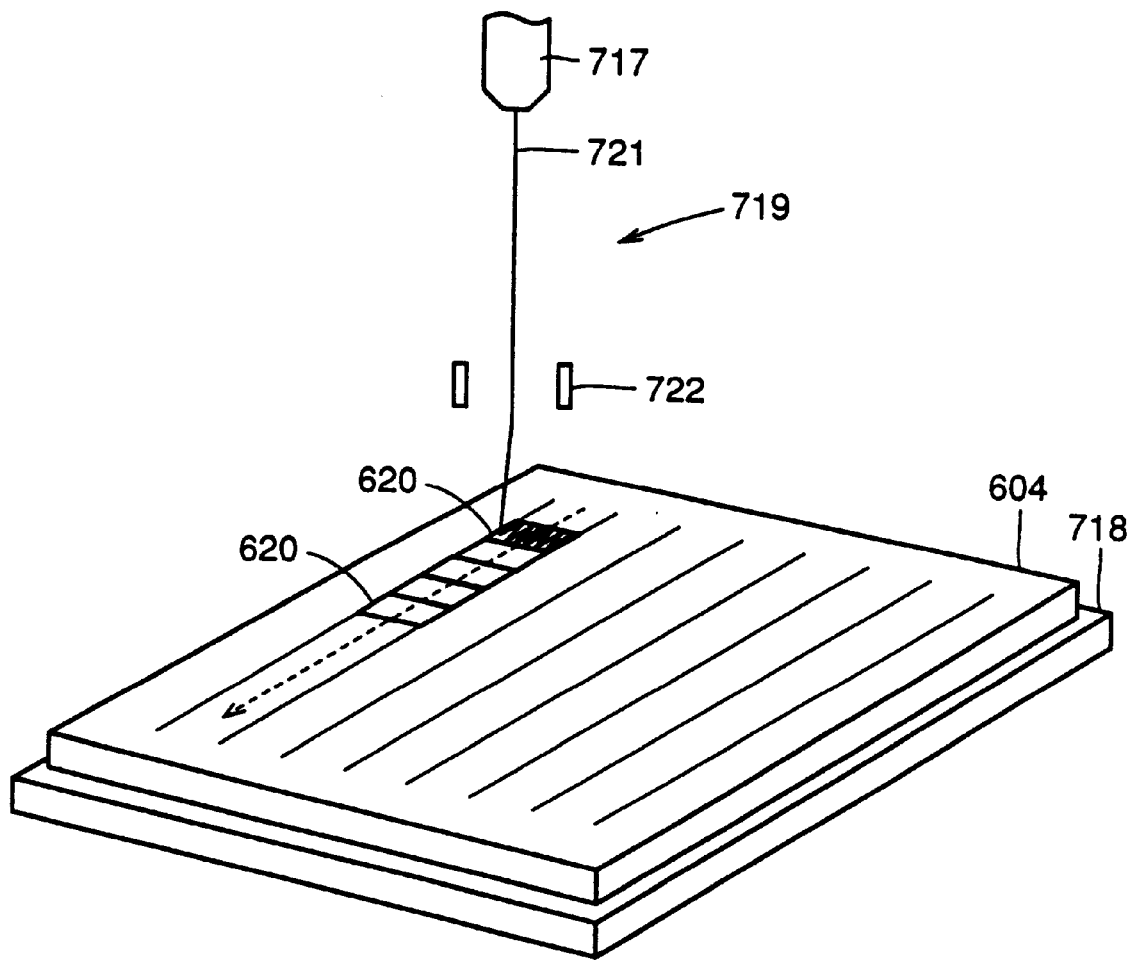
FIG. 17 is a schematic perspective view showing a raster scan EB drawing device.
Figure 18:
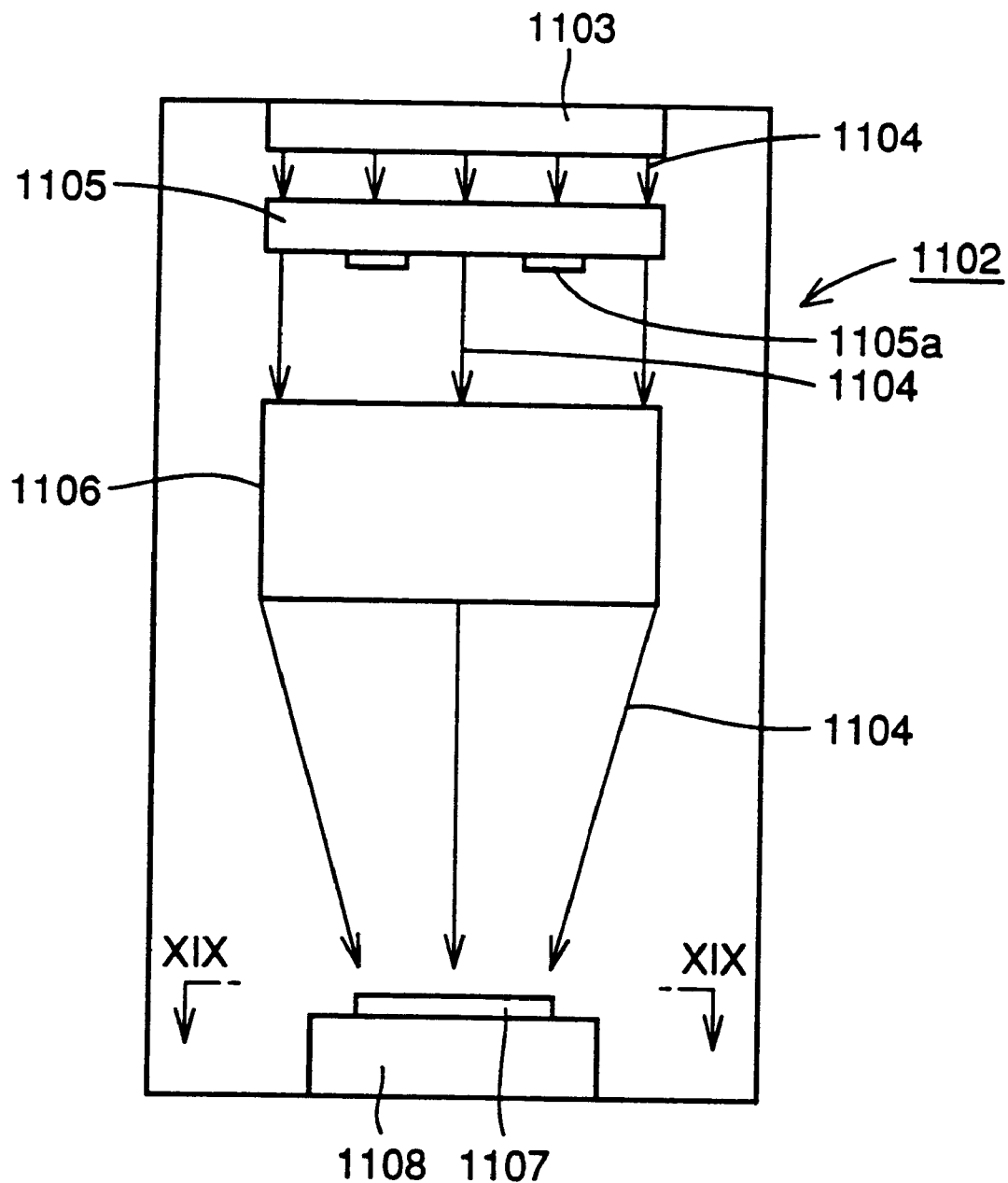
FIG. 18 is a schematic view of a first stepper for showing a field strain in the prior art.
Figure 19:
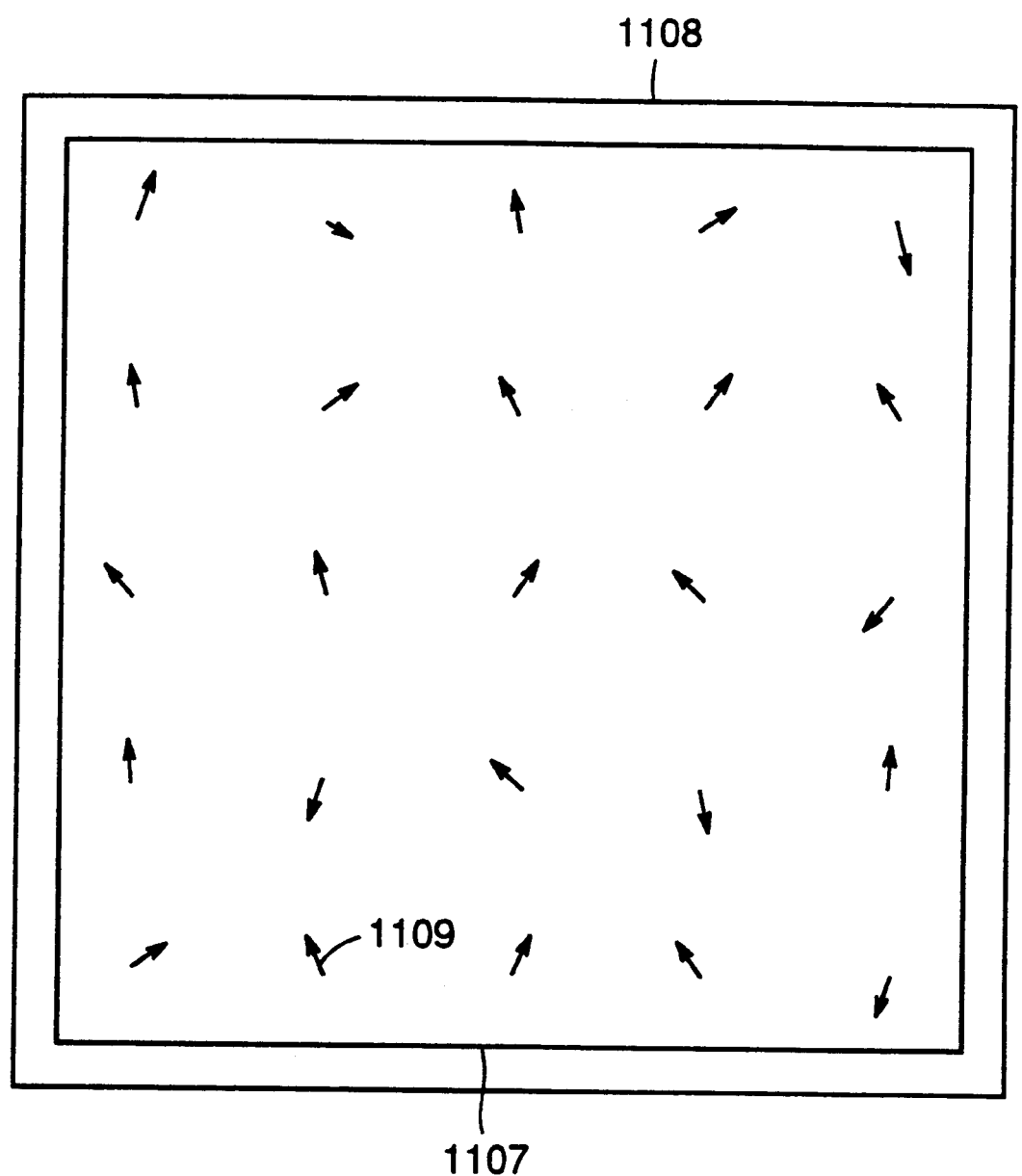
FIG. 19 is a plan taken along line XIX—XIX in FIG. 18.
Figure 20:
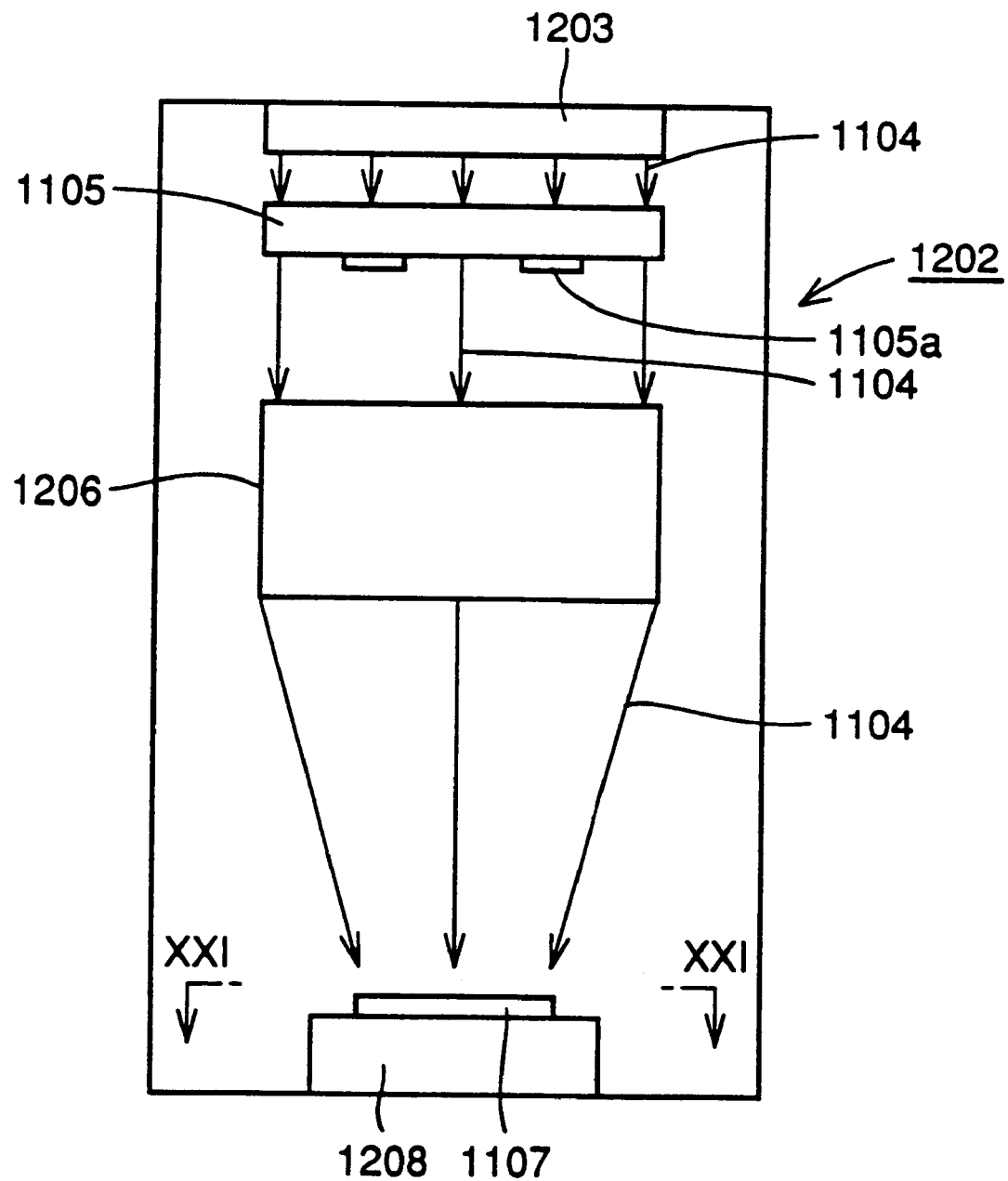
FIG. 20 is a schematic view of a second stepper for showing a field strain in the prior art.
Figure 21:
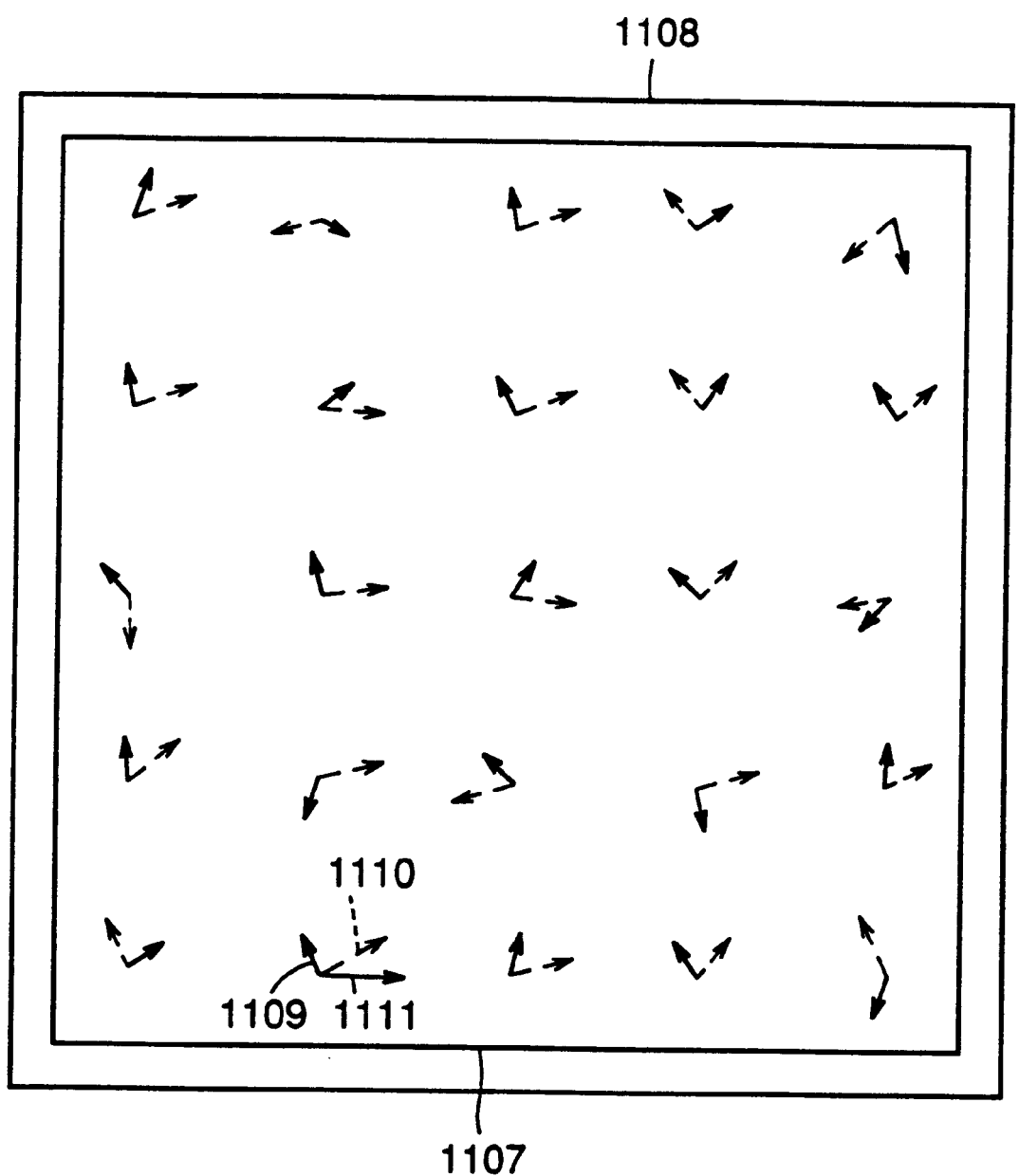
FIG. 21 is a plan taken along line XXI—XXI in FIG. 20.
Figure 22A:
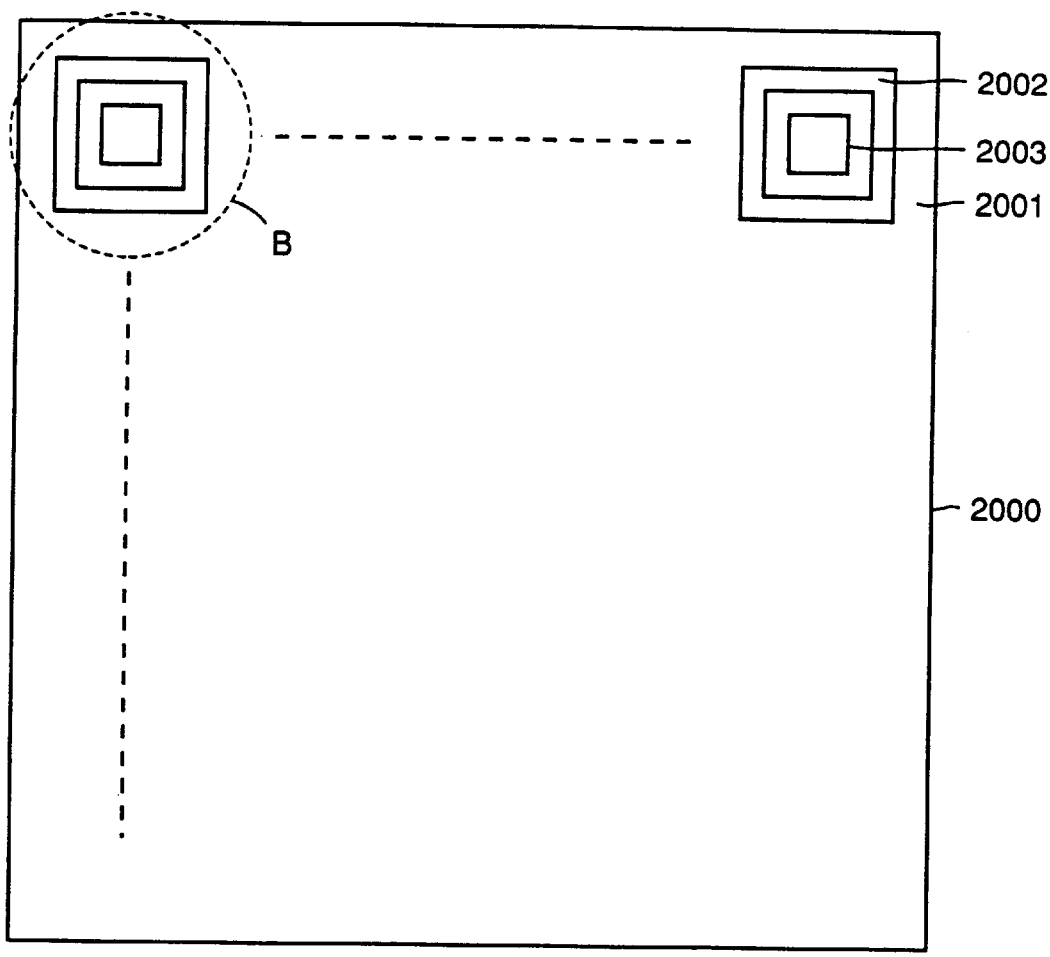
FIG. 22A shows a conventional interconnection pattern.
Figure 22B:
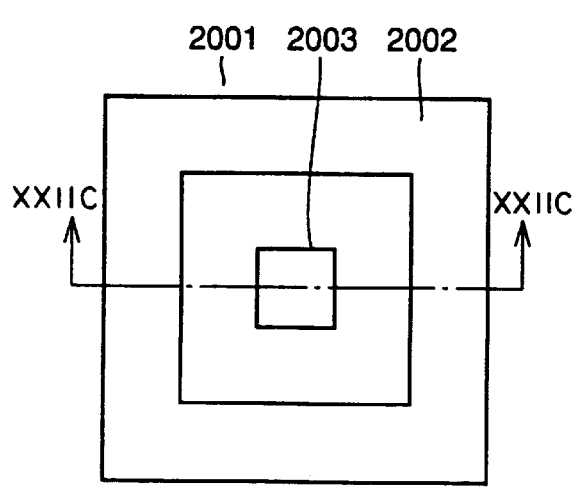
FIG. 22B is a plan showing, on an enlarged scale, a portion surrounded by line B in FIG. 22A.
Figure 22C:
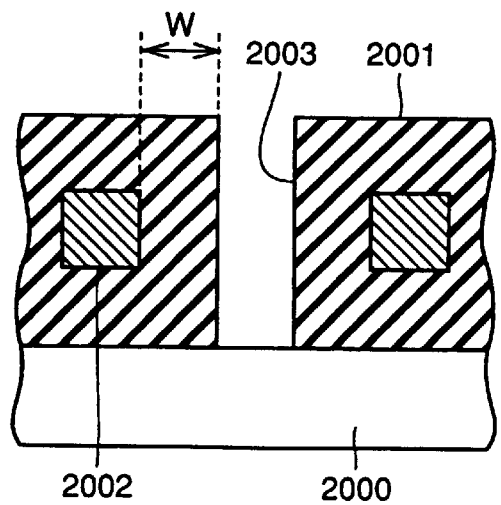
FIG. 22C is a cross section taken along line XXIIC—XXIIC in FIG. 22B.

Although the embodiment 1 already described uses the vector scan EB drawing device for effecting drawing on the photomask, an embodiment 2 used a raster scan EB (Electron Beam) drawing device. Referring to FIG. 17, a raster scan EB drawing device 719 includes a beam generator 717, deflection electrodes 722 and a stage 718.

Beam generator 717 generates electron beams 721 in a linear form. Deflection electrodes 722 change the traveling direction of electron beams 721. Mask blank 604 is laid on stage 718. Predetermined figures are to be drawn on mask blank 604.

For drawing the figures, electron beams 712 reciprocate in one drawing unit 620 for drawing the figure, and then move to the next drawing unit 620. Therefore, the position correction which has already described in connection with the embodiment 1 can be effected on each of drawing units 620 based on a certain point in the drawing unit, whereby a photomask having high overlay accuracy can be obtained.

(Embodiment 3)

The embodiment 1 has been described in connection with the photomask manufacturing method which can reduce the position deviation between the first and second resist layers formed by the first and second steppers, respectively. Conversely, an embodiment 3 will be described below in connection with a photomask manufacturing method, which can reduce the position deviation between the first and second resist layers formed under different optical conditions. According to the embodiment 3, in step 100 shown in FIG. 10, first resist patterns of N in number are formed by a stepper under first optical conditions in which σ coherency u of lighting is 0.3.

In step 200, second resist patterns of N in number are formed by the same stepper under second optical conditions, in which σ is 0.8. Thereafter, steps similar to those in the embodiment 1 are carried out, and thereby it is possible to manufacture a photomask, which can achieve high overlay accuracy even when different optical conditions are employed.

(Embodiment 4)

Although the embodiment 3 described above uses the vector scan EB drawing device for effecting drawing on the photomask similarly to the embodiment 1, an embodiment 4 uses a raster scan EB drawing device for the same purpose. In this embodiment, a photomask achieving high overlay accuracy can be manufactured with the raster scan EB drawing device.

(Embodiment 5)

Figure 23:
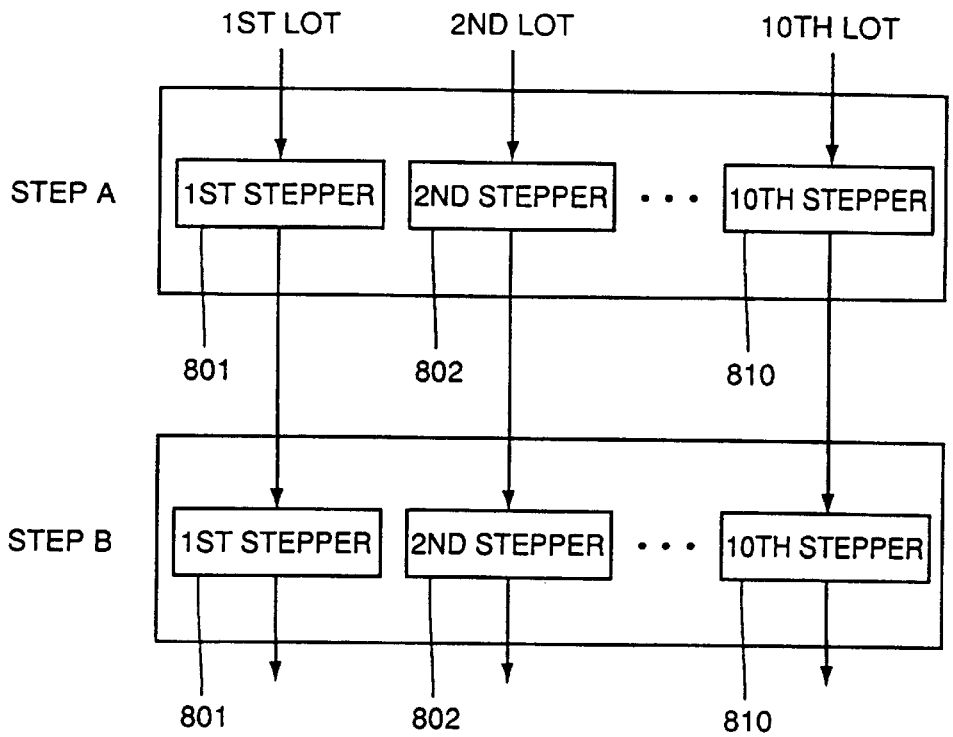
FIG. 23 shows steps of manufacturing the semiconductor device of a comparative example.

First, an example of the method of manufacturing a semiconductor device as a comparative example, for forming fine patterns having overlay accuracy of at most 0.15μm will be described. When semiconductor devices are to be formed on one hundred semiconductor substrates by using steppers, for example, the semiconductor substrates are divided into first to tenth lots, as shown in FIG. 23. One lot includes ten semiconductor substrates. Thereafter, identical photomasks for the first pattern are attached on first to tenth steppers 801 to 810. In accordance with step A, the first pattern is formed on the semiconductor substrates of the first lot by using the first stepper 801. The first patterns are formed on the semiconductor substrates of the second to tenth lots by using the second to tenth steppers 802 to 810.

Photomasks of the first to tenth steppers 801 to 810 are changed to photomasks for the second pattern. The photomasks for the second pattern are all identical. In accordance with step B, the second pattern is formed by using the first step 801 to be overlaid on the first pattern, on the semiconductor substrate of the first lot. The second patterns are formed overlaying on the first pattern by using the second to tenth steppers 802 to 810 on the semiconductor substrates of the second to tenth lots. By repeating these steps, it is possible to manufacture semiconductor devices by successively forming a plurality of patterns with the overlay accuracy of at most 0.15 μm, using the same steppers for respective ones of the first to tenth lots.

In the above described manufacturing method, when all steppers are in operation, process capability, that is, the amount of semiconductor devices which can be produced, is the product of the number of steppers multiplied by expected capability of one stepper. Here, the expected capability is the product of operating rate of the stepper by the maximum processing capability. Generally, the operating rate is defined by standby time, failure time, maintenance time and so one and it is about 80%.

Figure 24:
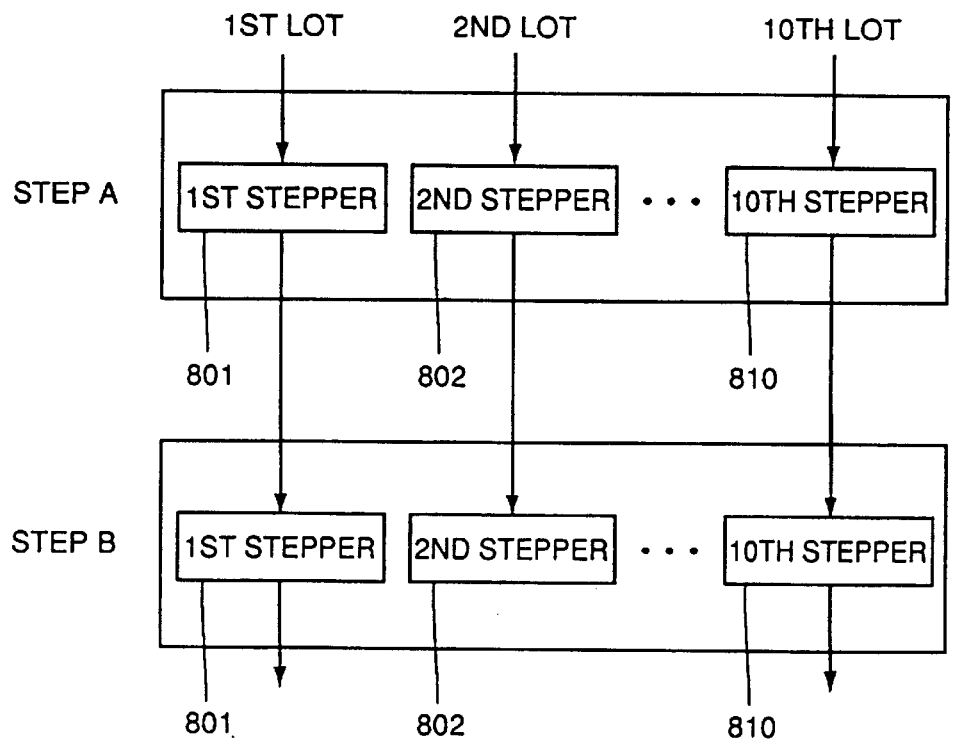
FIG. 24 shows steps of manufacturing the semiconductor device in accordance with a comparative example when one stepper is out of order.
Figure 25:
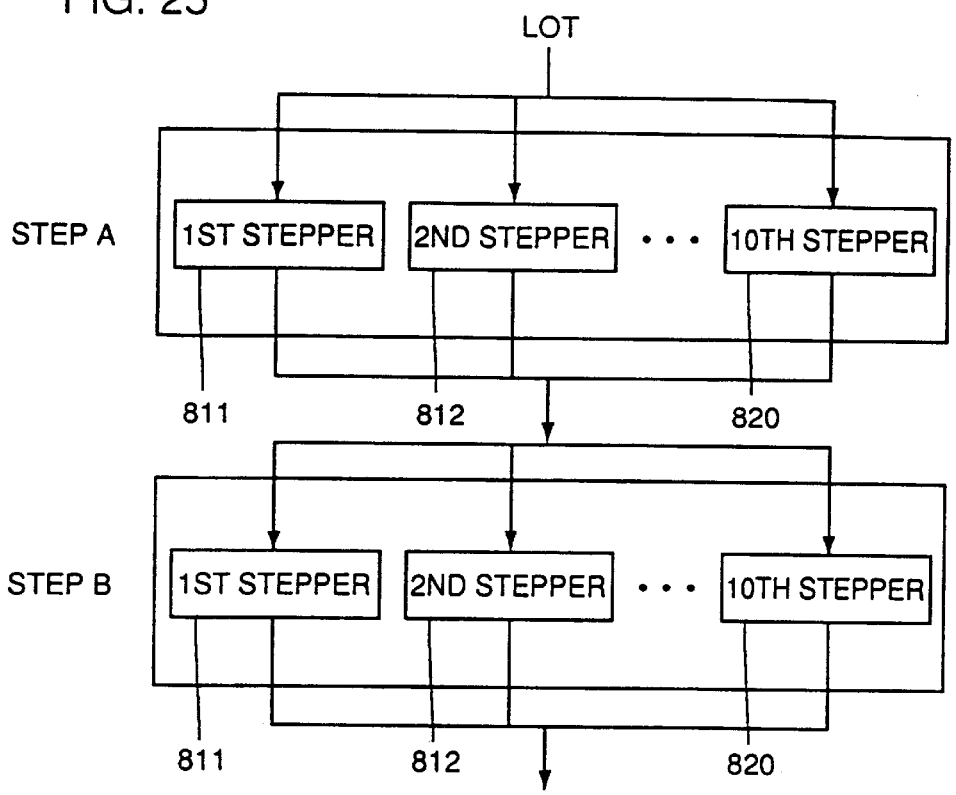
FIG. 25 shows steps of manufacturing the semiconductor device in accordance with the present invention.

Let us consider the amount of production of the semiconductor devices when one stepper fails. Referring to FIG. 24, in step A, the first pattern is formed on the semiconductor substrates of the first to tenth lots by the first to tenth steppers 801 to 810, respectively. Assume that the second stepper 802 fails in forming the second pattern on the semiconductor substrates of the first to tenth lots in step B.

In this case, it is not possible to form the second pattern on the semiconductor substrates of the second lot by using the second stopper 802. If the second pattern is to be formed on the semiconductor substrates of the second lot by using a stepper other than the second stepper 802, a pattern with high overlay accuracy cannot be formed because of difference in field strains between steppers. Accordingly, semiconductor devices having the patterns with overlay accuracy of at most 0.15 cannot be formed on the semiconductor substrates of the second lot, thus the throughput of the semiconductor substrates is lowered.

Generally, the number of steppers required in a factory manufacturing semiconductor devices having overlay accuracy of about 0.15 μm is from ten to twenty. Therefore, when one stepper fails, the throughput of the semiconductor devices will be degraded by 5 to 10%.

The method of manufacturing the semiconductor device for forming patterns with overlay accuracy of at most 0.15 μm using the photomask manufactured in accordance with Embodiment 1 or 2 will be described. When patterns having overlay accuracy of at most 0.15 μm is to be formed on one hundred semiconductor substrates by using ten steppers, first, first to tenth steppers 811 to 820 are prepared. A photomask for the first pattern is attached to the first stepper 811. A photomask for the first pattern manufactured in accordance with Embodiment 1 or 2, that is, a photomask which can reduced difference in field strain between the first and second steppers 811 and 812, is attached to the second stepper 812. The photomask manufactured in accordance with Embodiment 1 or 2 which reduces difference in field strain from the first stepper 811 is also attached to other steppers.

The first pattern is formed on one hundred semiconductor substrates classified into lots, by using the first to tenth steppers 811 to 820.

Thereafter, the photomask of the first stepper 811 is changed to one for manufacturing the second pattern. To the second to tenth steppers 812 to 820, a photomask for the second pattern manufactured in accordance with Embodiment 1 or 2, that is, one which reduces difference in field strains between the first stepper 811 and each of the second to tenth steppers 812 to 820 is attached. On the one hundred semiconductor substrates on which the first pattern has been formed, the second pattern is formed by using the first to tenth steppers 811 to 820. At this time, on the semiconductor substrate on which the first pattern has been formed by the first stepper 811, the second pattern is formed by any of the first to tenth steppers 811 to 820. By repeating the above described steps, semiconductor devices having a plurality of patterns with overlay accuracy of at most 0.15 μm formed on respective semiconductor substrates can be manufactured.

In this method, unlike the prior art, the lots put in the process are not allotted to different steppers but treated as one group. Therefore, it is possible to manufacture semiconductor devices while forming patterns with high overlay accuracy without using separate steppers for separate lots. When the throughput of patterns by one stepper is smaller as compared with other steppers, the semiconductor substrates which exceeded the capacity of the stepper having the small throughput can be processed by other stepper. As a result, the time of waiting of the semiconductor substrates to be processed can be reduced as compared with the prior art. Therefore, the processing period can be reduced and standby period of the device can be reduced. Thus the operating rate of the device can be increased.

Figure 26:
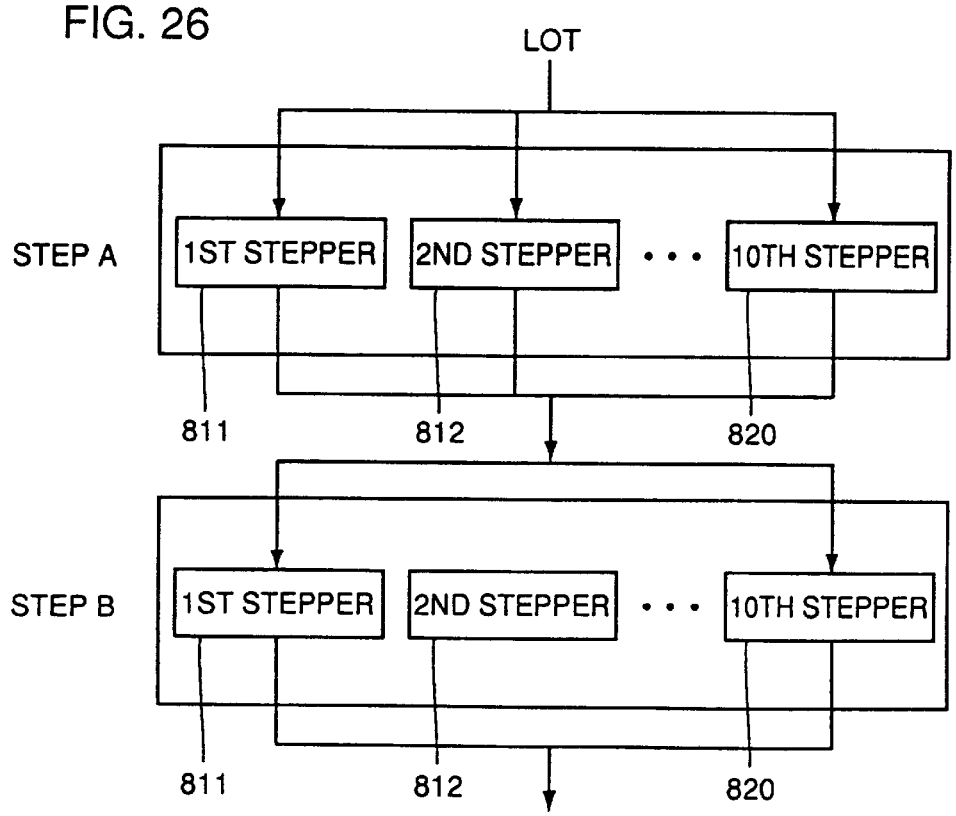
FIG. 26 shows steps of manufacturing the semiconductor device in accordance with the present invention when one stepper is out of order.

Assume that one stepper fails in the manufacturing method described above. Referring to FIG. 26, the first pattern is formed on one hundred semiconductor substrates divided into lots, by using the first to tenth steppers 811 to 820. Here, the mask for the first pattern is attached to the first stepper 811. The photomask formed in accordance with Embodiment 1 or 2, that is, the photomask which reduces difference in field strains between the first stepper 811 and each of the second to tenth steppers 812 to 820 is attached to the second to tenth steppers 812 to 820.

The photomask for the second pattern is attached to the first stepper 811. To the second to tenth steppers 812 to 820, the photomask for the second pattern manufactured in accordance with Embodiment 1 or 2, that is, the photomask which reduces difference in fail strain between the first stepper 811 and each of the second to tenth steppers 812 to 820 is attached. Assume that the second stepper 812 fails when the second pattern is manufactured on the one hundred semiconductor substrates by using the first to tenth steppers 811 to 820. In this case, the second pattern can be formed on the semiconductor substrates on which the second pattern is to be formed by the second stepper 812, by other stepper. Further, as already described, the expected process capacity is 80% as compared with the process capability when all the steppers are continuously in operation. Therefore, even when the semiconductor substrates which should have been processed by the failed stepper are allotted to other steppers, the overall processing capacity is not lowered, and what occurs is that the operation rate of other steppers increases from 80%. Therefore, as compared with the method of manufacturing the semiconductor device shown in FIGS. 23 and 24, the present invention is advantageous in that the throughput of the semiconductor devices is not degraded even when one stepper fails.

(Embodiment 6)

Figure 27:
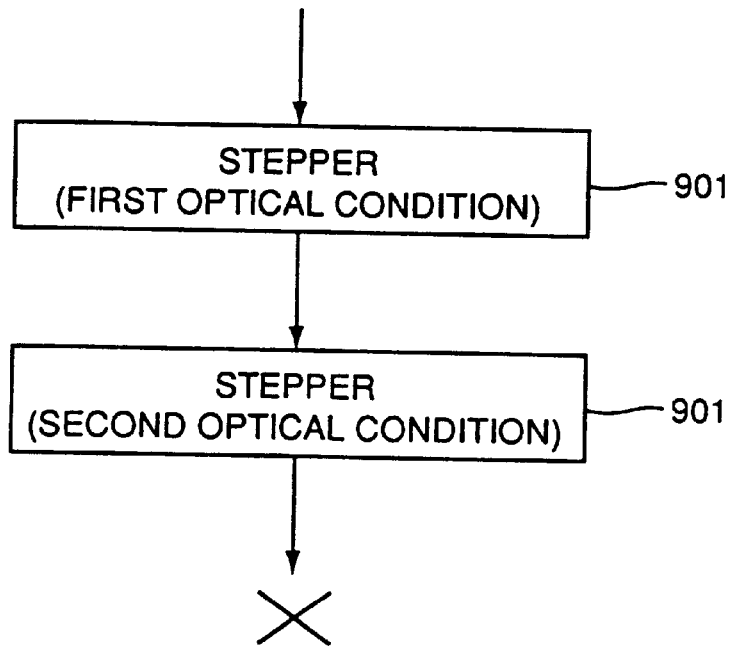
FIG. 27 shows steps of manufacturing the semiconductor device under different optical conditions in accordance with a comparative example.

Referring to FIG. 27, a halftone photomask is attached to a stepper 901. The first pattern is formed on a semiconductor substrate by using the stepper 901 under first optical condition ($\sigma$=0.2 to 0.3).

Then, a common photomask having a chromium pattern is attached to stepper 901. By using stepper 901, the second pattern is formed overlaid on the first pattern under a second optical condition ($\sigma$=0.8). In this case, since the first and second optical conditions are different, the difference in field strains under the first and second optical conditions is too large to form the patterns having the overlay accuracy of at most 0.15 $\mu$m.

Figure 28:
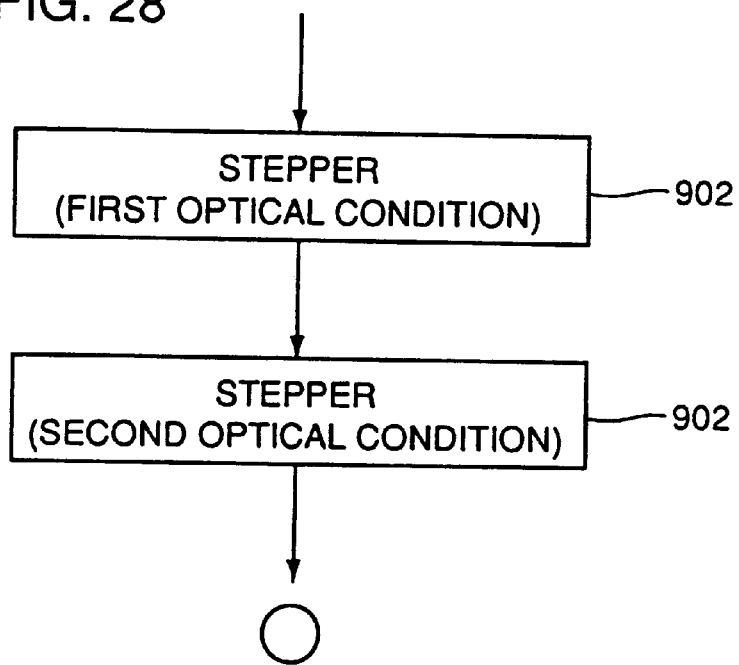
FIG. 28 shows the method of manufacturing the semiconductor device under different optical conditions in accordance with the present invention.

The method of manufacturing semiconductor devices using the photomask in accordance with Embodiment 3 or 4 will be described. Referring to FIG. 28, a halftone photomask is attached to stepper 902. The first pattern is formed on the semiconductor substrate by using stepper 902 under the first optical condition ($\sigma$=0.2 to 0.3).

Thereafter, a photomask for the second pattern manufactured in accordance with Embodiment 3 or 4, that is, the photomask which reduces difference in field strains derived from different optical conditions is attached to stepper 902. By using stepper 902, the second pattern is formed on the first pattern under the second optical condition ($\sigma$=0.8). In accordance with this method, the difference in field strains derived from different optical conditions can be reduced. Therefore, even when optical condition is changed, semiconductor devices can be manufactured while forming patterns with overlay accuracy of at most 0.15 $\mu$m.

[Actual Examples]

In actual examples, comparison was made between overlay accuracy of a photomask manufactured in a conventional method and that of a photomask manufactured according to the invention. First, first resist patterns were formed by a first stepper provided with a mask manufactured in a conventional method.

Then, second resist patterns were formed by a second stepper provided with a mask manufactured in a conventional method. First patterns were 484 in number, and second patterns were also 484 in number. An average of 484 deviations between the first and second resist patterns was 0.05 $\mu$m.

Then, 484 first resist patterns were formed by the first stepper provided with the mask which was manufactured in the conventional method. Then, 484 second resist patterns were formed by the second stepper provided with the mask which was manufactured in the method of the embodiment 1 of the invention. 484 deviations between the first and second resist patterns were determined. The average deviation was 0.01 $\mu$m. It can be understood, therefore, that use of the mask according to the invention can improve the overlay accuracy compared with the conventional mask.

The photomask manufacturing method according to the invention can provide the photomask allowing formation of layers with high overlay accuracy.

According to the invention, it is also possible to manufacture the photomask allowing formation of layers with high overlay accuracy even if different steppers are used.

According to the invention, it is further possible to manufacture the photomask allowing formation of layers with high overlay accuracy even if different optical conditions are employed.

According to the invention, it is possible to improve overlay accuracy by employing a simple calculation program.

According to the photomask manufacturing apparatus of the invention, it is possible to manufacture the photomask allowing formation of layers with high overlay accuracy.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a photomask comprising the steps of:

forming first resist patterns of N in number on a semiconductor substrate using a mask provided with standardized mask patterns of N in number;

forming second resist patterns of N in number with a mask located at a position shifted in a predetermined direction by a predetermined distance from a relative position of the mask in said step of forming said first resist patterns with respect to said semiconductor substrate;

measuring N deviation quantities of the resist pattern positions by comparing said N first resist patterns with said N second resist patterns;

calculating N quantities for shifting the mask pattern positions for said N standardized mask patterns based on said N deviation quantities of said resist pattern positions, respectively;

calculating M quantities for shifting drawing fields from said quantities for shifting said mask pattern positions in drawing units for drawing the mask patterns; and drawing the predetermined mask patterns on a mask substrate by shifting the positions of said M drawing fields in said drawing units in accordance with said M quantities for shifting said drawing fields, respectively.

2. The method of manufacturing the photomask according to claim 1, wherein said step of forming said first resist patterns includes the step of forming said first resist patterns with a first reducing projection exposure device having said mask set therein, and said step of forming said second resist patterns includes the step of forming said second resist patterns with a second reducing projection exposing device having said mask set therein.

3. The method of manufacturing the photomask according to claim 1, wherein said step of forming said first resist patterns includes the step of forming said first resist patterns with a reducing projection exposing device under first optical conditions, and said step of forming said second resist patterns includes the step of forming said second resist patterns with said reducing projection exposing device under second optical conditions.

4. The method of manufacturing the photomask according to claim 1, wherein said step of calculating said quantity for shifting said drawing field includes calculation of the quantity for shifting at a center of each of said drawing fields.

5. A method of manufacturing a semiconductor device for forming patterns with overlay accuracy of at most 0.15 μm, comprising the steps of:

forming a first pattern on a semiconductor substrate by using a first reducing projection exposure device; and forming a second pattern overlaid on said first pattern by using a second reducing projection exposure device different from said first reducing projection exposure device.

6. A method of manufacturing a semiconductor device for forming patterns with overlay accuracy of at most 0.15 μm, comprising the steps of:

forming a first pattern under a first optical condition on a semiconductor substrate using a reducing projection exposure device; and forming a second pattern overlaid on said first pattern under a second optical condition different from said first optical condition using said reducing projection exposure device.

* * * * *